(12) United States Patent
Kimura

(10) Patent No.: US 10,153,045 B2
(45) Date of Patent: Dec. 11, 2018

(54) SEMICONDUCTOR MEMORY DEVICE

(71) Applicant: Toshiba Memory Corporation, Tokyo (JP)

(72) Inventor: Keita Kimura, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/688,846

(22) Filed: Aug. 28, 2017

(65) Prior Publication Data

US 2018/0197611 A1    Jul. 12, 2018

(30) Foreign Application Priority Data

Jan. 6, 2017    (JP) .................. 2017-001237

(51) Int. Cl.
*G11C 16/10*   (2006.01)
*G11C 16/24*   (2006.01)
*G11C 16/04*   (2006.01)

(52) U.S. Cl.
CPC .......... *G11C 16/10* (2013.01); *G11C 16/0466* (2013.01); *G11C 16/24* (2013.01)

(58) Field of Classification Search
None
See application file for complete search history.

(56) References Cited

U.S. PATENT DOCUMENTS 7,355,887 B2    4/2008 Nakamura et al.
7,858,902 B2   12/2010 Maejima
8,300,444 B2   10/2012 Nagashima et al.
8,385,115 B2    2/2013 Lee et al.
8,427,881 B2    4/2013 Jang et al.
2012/0327716 A1 12/2012 Mokhlesi et al.

(Continued)

FOREIGN PATENT DOCUMENTS

JP    2009-266946 A    11/2009
JP       4405405 B2     1/2010

(Continued)

OTHER PUBLICATIONS

Taiwan Office Action dated Feb. 21, 2018, filed in Taiwan counterpart Application No. 106104201, 8 pages (with translation).

*Primary Examiner* — James G Norman
(74) *Attorney, Agent, or Firm* — Patterson & Sheridan, LLP

(57) ABSTRACT

A semiconductor memory device includes first and second memory cells, first and second select transistors having first ends connected to the first and second memory cells, respectively, first and second bit lines connected to second ends of the first and second select transistors, respectively, and a select gate line connected to the first and second select transistors. A write operation includes first and second program loops. While a program pulse is being applied to a word line, a first voltage is applied to the first bit line, a second voltage to the second bit line, and a third voltage to the select gate line. Before the program pulse is applied to the word line, the second voltage is applied to the second bit line and a fourth voltage is applied to the select gate line for different time periods while in the first and second program loops, respectively.

15 Claims, 14 Drawing Sheets

(56) References Cited

U.S. PATENT DOCUMENTS

2016/0005474 A1     1/2016  Goda et al.
2016/0099066 A1*    4/2016  Dunga ................... G11C 16/24
                                                         365/185.17

FOREIGN PATENT DOCUMENTS

JP           5253784  B2     7/2013
JP           5599049  B2    10/2014

* cited by examiner

SEMICONDUCTOR MEMORY DEVICE

This application is based upon and claims the benefit of priority from Japanese Patent Application No. 2017-001237, filed on Jan. 6, 2017, the entire contents of which are incorporated herein by reference.

FIELD

Embodiments described herein relate generally to semiconductor memory devices.

BACKGROUND

As a semiconductor memory device, a NAND flash memory is known.

DETAILED DESCRIPTION

Figure 1:
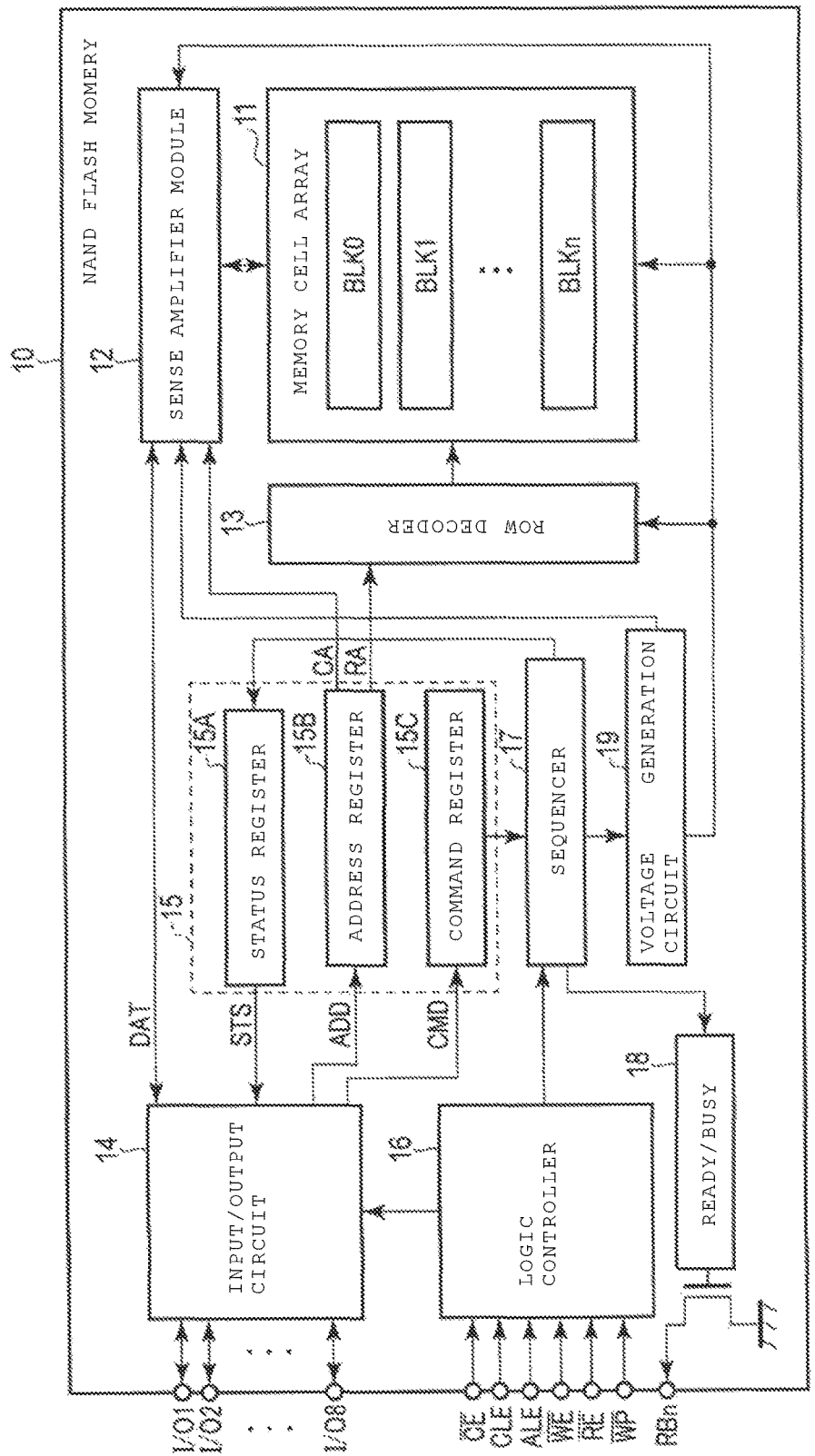
FIG. 1 is a block diagram of a semiconductor memory device according to a first embodiment.

Embodiments provide a semiconductor memory device that can improve the reliability of data.

In general, according to one embodiment, a semiconductor memory device includes first and second memory cell transistors, a first select transistor having a first end connected to one end of the first memory cell transistor, a second select transistor having a first end connected to one end of the second memory cell transistor, a first bit line connected to a second end of the first select transistor, a second bit line connected to a second end of the second select transistor, a first word line connected to gates of the first and second memory cell transistors, and a first select gate line connected to gates of the first and second select transistors. A write operation on the first and second memory cell transistors includes a first program loop and a second program loop following the first program loop, and the first and second program loops each include one or more loops of a program operation during which a program pulse is applied to the first word line and a verification operation following the program operation, and the program operation of each loop of the first and second program loops includes a precharge phase and a programing phase following the precharge phase. During the programming phase, while the program pulse is being applied to the first word line, a first voltage is applied to the first bit line, a second voltage higher than the first voltage is applied to the second bit line, and a third voltage higher than the second voltage is applied to the first select gate line. During the precharge phase, the second voltage is applied to the second bit line and a fourth voltage higher than the third voltage is applied to the first select gate line, and a period in which the fourth voltage is applied to the first select gate line during the precharge phase within the second program loop is longer than a period in which the fourth voltage is applied to the first select gate line during the precharge phase within the first program loop.

Hereinafter, embodiments will be described with reference to the drawings. The drawings are schematic drawings. Each embodiment illustrates a device or a method for embodying the technical idea of the embodiment.

In the following description, component elements having substantially the same function and configuration will be identified with the same character. A numeral added as a suffix to letters forming a reference character is used to distinguish between elements having the same configuration which are referred to by the same reference characters. If there is no need to distinguish between elements which are referred to by the same reference characters, these elements are referred to by only the letters.

First Embodiment

Hereinafter, a semiconductor memory device according to a first embodiment will be described.
[1-1] Configuration
[1-1-1] Configuration of a Semiconductor Memory Device 10

First, the configuration of a semiconductor memory device 10 will be described by using FIG. 1. FIG. 1 depicts a block diagram of the semiconductor memory device 10. The semiconductor memory device 10 is a NAND flash memory that stores data in a nonvolatile manner. As depicted in FIG. 1, the semiconductor memory device 10 includes a memory cell array 11, a sense amplifier module 12, a row decoder 13, an input/output circuit 14, a register 15, a logic control circuit 16, a sequencer 17, a ready/busy control circuit 18, and a voltage generation circuit 19.

The memory cell array 11 includes blocks BLK0 to BLKn (n is a natural number greater than or equal to 1). The block BLK is a group of a plurality of nonvolatile memory cells correlated with bit lines and word lines and is, for example, a unit by which data is erased. The semiconductor memory device 10 can hold data using a multilevel cell (MLC) by which each memory cell is made to store data of 2 bits or more. The present embodiment will exemplify a case in which the memory cell is made to store 2-bit data.

The sense amplifier module 12 outputs data DAT read from the memory cell array 11 to an external controller via the input/output circuit 14. Moreover, the sense amplifier module 12 transfers write data DAT received from the external controller via the input/output circuit 14 to the memory cell array 11.

The row decoder 13 selects a word line corresponding to a memory cell on which a read operation and a write operation are to be performed. Then, the row decoder 13 applies a desired voltage to each of the selected word line and a non-selected word line.

The input/output circuit 14 sends and receives, for example, 8-bit-width input/output signals I/O (I/O1 to I/O8) between the input/output circuit 14 and the external controller. For example, the input/output circuit 14 transfers the write data DAT contained in the input/output signal I/O received from the external controller to the sense amplifier module 12. Moreover, the input/output circuit 14 sends the read data DAT transferred from the sense amplifier module 12 to the external controller as the input/output signal I/O.

The register 15 includes a status register 15A, an address register 15B, and a command register 15C. The status register 15A holds status information STS. The status information STS contains information indicating an operation state of the sequencer 17, for example. The address register 15B receives address information ADD from the input/output circuit 14 and holds this address information ADD. Then, the address register 15B transfers a column address signal CA and a row address signal RA which are contained in the address information ADD to the sense amplifier module 12 and the row decoder 13, respectively. The command register 15C receives a command CMD from the input/output circuit 14 and holds this command CMD. Then, the sequencer 17 performs various operations based on the command CMD held in the command register 15C.

The logic control circuit 16 receives various control signals from the external controller and controls the input/output circuit 14 and the sequencer 17. As the control signals, for example, a chip enable signal /CE, a command latch enable signal CLE, an address latch enable signal ALE, a write enable signal /WE, a read enable signal /RE, and a write-protect signal /WP are used. The signal /CE is a signal for enabling the semiconductor memory device 10. The signal CLE is a signal that notifies the input/output circuit 14 that a signal which is input to the semiconductor memory device 10 in parallel with the asserted signal CLE is a command CMD. The signal ALE is a signal that notifies the input/output circuit 14 that a signal which is input to the semiconductor memory device 10 in parallel with the asserted signal ALE is address information ADD. The signals /WE and /RE are signals that give an instruction to the input/output circuit 14 to input and output the input/output signals I/O1 to I/O8, for example. The signal /WP is a signal for causing the semiconductor memory device 10 to enter a protected state when the power to the semiconductor memory device 10 is turned on/off, for example.

The sequencer 17 controls the operation of the entire semiconductor memory device 10. Specifically, the sequencer 17 controls the sense amplifier module 12, the row decoder 13, the voltage generation circuit 19, and so forth based on the command CMD transferred from the command register 15C and performs a data write operation, a data read operation, and so forth. Moreover, the sequencer 17 includes a counter (which is not shown). This counter is used at the time of a write operation and counts the number of repetitions of a program loop, which will be described later.

The ready/busy control circuit 18 generates a ready/busy signal RBn based on the operation state of the sequencer 17 and sends this signal RBn to the external controller. The signal RBn is a signal that provides the external controller with a notification as to whether the semiconductor memory device 10 is in a ready state in which the semiconductor memory device 10 accepts an instruction from the external controller or in a busy state in which the semiconductor memory device 10 does not accept the instruction.

The voltage generation circuit 19 generates a desired voltage based on an instruction from the sequencer 17. Then, the voltage generation circuit 19 supplies the generated voltage to the memory cell array 11, the sense amplifier module 12, and the row decoder 13.

[1-1-2] Configuration of the Memory Cell Array 11

Figure 2:
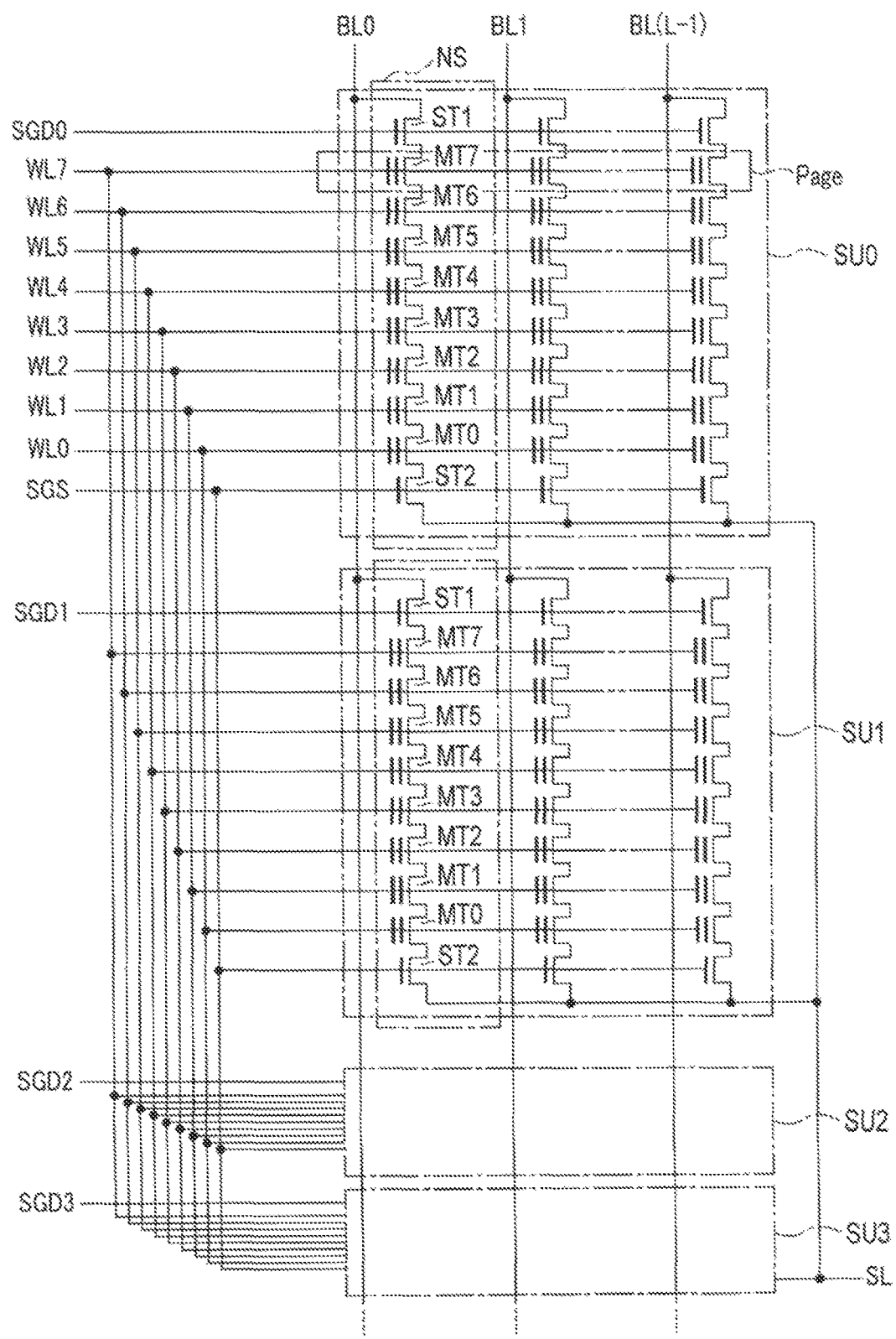
FIG. 2 is a circuit diagram of a memory cell array of the semiconductor memory device according to the first embodiment.

Next, the configuration of the memory cell array 11 will be described by using FIG. 2. FIG. 2 is a circuit diagram of the memory cell array 11 and depicts a detailed circuit configuration of one block BLK in the memory cell array 11. As depicted in FIG. 2, the block BLK includes string units SU0 to SU3, for example.

Each of the string units SU includes a plurality of NAND strings NS. The NAND strings NS are provided, one for each of bit lines BL0 to BL(L-1) (where (L-1) is a natural number greater than or equal to 1). Each NAND string NS includes, for example, eight memory cell transistors MT (MT0 to MT7) and select transistors ST1 and ST2. It is to be noted that the number of memory cell transistors MT included in one NAND string NS is not limited to eight and may be set to any number.

Each memory cell transistor MT includes a control gate and a charge storage layer and holds data in a nonvolatile manner. The memory cell transistors MT0 to MT7 are connected in series between the source of the select transistor ST1 and a drain of the select transistor ST2. The control gates of the memory cell transistors MT0 to MT7 in the same block are commonly connected to word lines WL0 to WL7, respectively.

The gates of the select transistors ST1 in the string units SU0 to SU3 are commonly connected to select gate lines SGD0 to SGD3, respectively. The drains of the select transistors ST1 in the same column in the same block BLK are commonly connected to the corresponding bit line BL. Furthermore, the drains of the select transistors ST1 in the same column are commonly connected to one another across the plurality of blocks BLK. The gates of the select transistors ST2 in the same block are commonly connected to a select gate line SGS. The sources of the select transistors ST2 in the same block are commonly connected to a source line SL. Moreover, the sources of the select transistors ST2 are commonly connected to one another between the plurality of blocks BLK.

In the above configuration, a group of 1-bit data held by the plurality of memory cell transistors MT connected to a common word line WL is called a "page". Therefore, if one memory cell transistor MT is made to store 2-bit data, data of 2 pages is stored in a group of memory cells connected to one word line WL.

Figure 3:
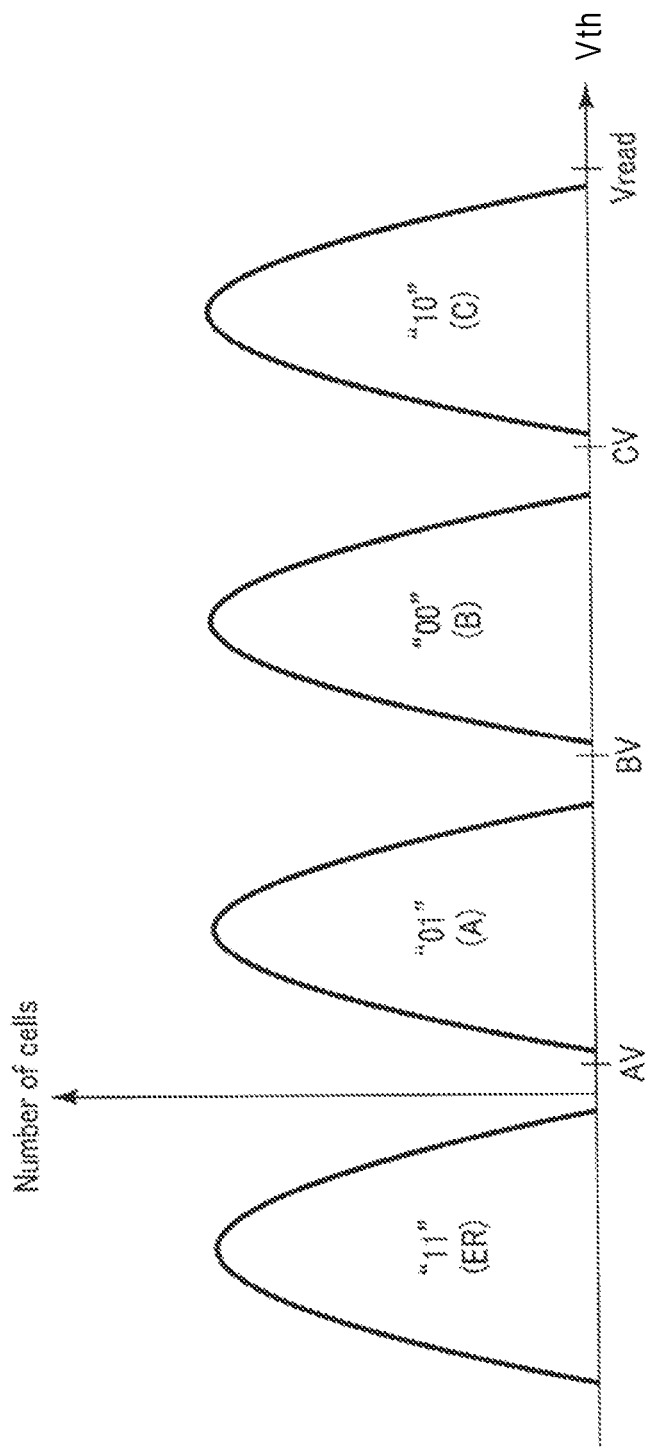
FIG. 3 is a threshold voltage distribution of memory cells of the semiconductor memory device according to the first embodiment.

A threshold voltage distribution of the memory cell transistors MT described above is depicted in FIG. 3, for example. FIG. 3 depicts the threshold voltage distribution of the memory cell transistors MT holding 2-bit data and voltages which are used at the time of verification. The vertical axis and the horizontal axis of FIG. 3 correspond to the number of memory cell transistors MT and a threshold voltage Vth, respectively.

If each memory cell transistor MT holds 2-bit data, the distribution of the threshold voltages thereof is divided into four parts as depicted in FIG. 3. These four threshold voltage distributions are referred to as, in the order of threshold voltage from lowest to highest, an "ER" level, an "A" level, a "B" level, and a "C" level. Then, for example, data "11", data "01", data "00", and data "10" are assigned to the "ER"-level threshold voltage distribution, the "A"-level threshold voltage distribution, the "B"-level threshold voltage distribution, and the "C"-level threshold voltage distribution, respectively. It is to be noted that the assignment of data to the threshold voltage distributions is not limited to the above example and may be changed in various ways.

Verification voltages AV, BV, and CV depicted in FIG. 3 are used for verifications of the "A" level, the "B" level, and the "C" level, respectively, at the time of a write operation. A read voltage Vread is a voltage at which the memory cell transistor MT whose gate received the read voltage Vread applied thereto is turned on irrespective of the data held thereby. The relationship of these voltage values is AV<BV<CV<Vread.

The threshold voltage of the memory cell transistor MT holding the data "11" is smaller than the voltage AV and corresponds to a data erasing state. The threshold voltage of the memory cell transistor MT holding the data "01" is greater than or equal to the voltage AV but smaller than BV. The threshold voltage of the memory cell transistor MT holding the data "00" is greater than or equal to the voltage BV but smaller than CV. The threshold voltage of the memory cell transistor MT holding the data "10" is greater than or equal to the voltage CV.

It is to be noted that writing and reading of data may be performed for each page or for each word line WL. At the time of a read operation, a determination is made about the level in which the threshold voltage of a memory cell transistor MT from which data is to be read is included. For this determination, various read voltages are set. A voltage for determining whether a certain memory cell transistor MT has a threshold voltage in the "ER" level or a threshold voltage in the "A" or higher level is set between a higher limit of the "ER" level and a lower limit of the "A" level. A voltage for determining whether a certain memory cell transistor MT has a threshold voltage in the "A" or lower level or a threshold voltage in the "B" or higher level is set between a higher limit of the "A" level and a lower limit of the "B" level. A voltage for determining whether a certain memory cell transistor MT has a threshold voltage in the "B" or lower level or a threshold voltage in the "C" level is set between a higher limit of the "B" level and a lower limit of the "C" level.

Figure 4:
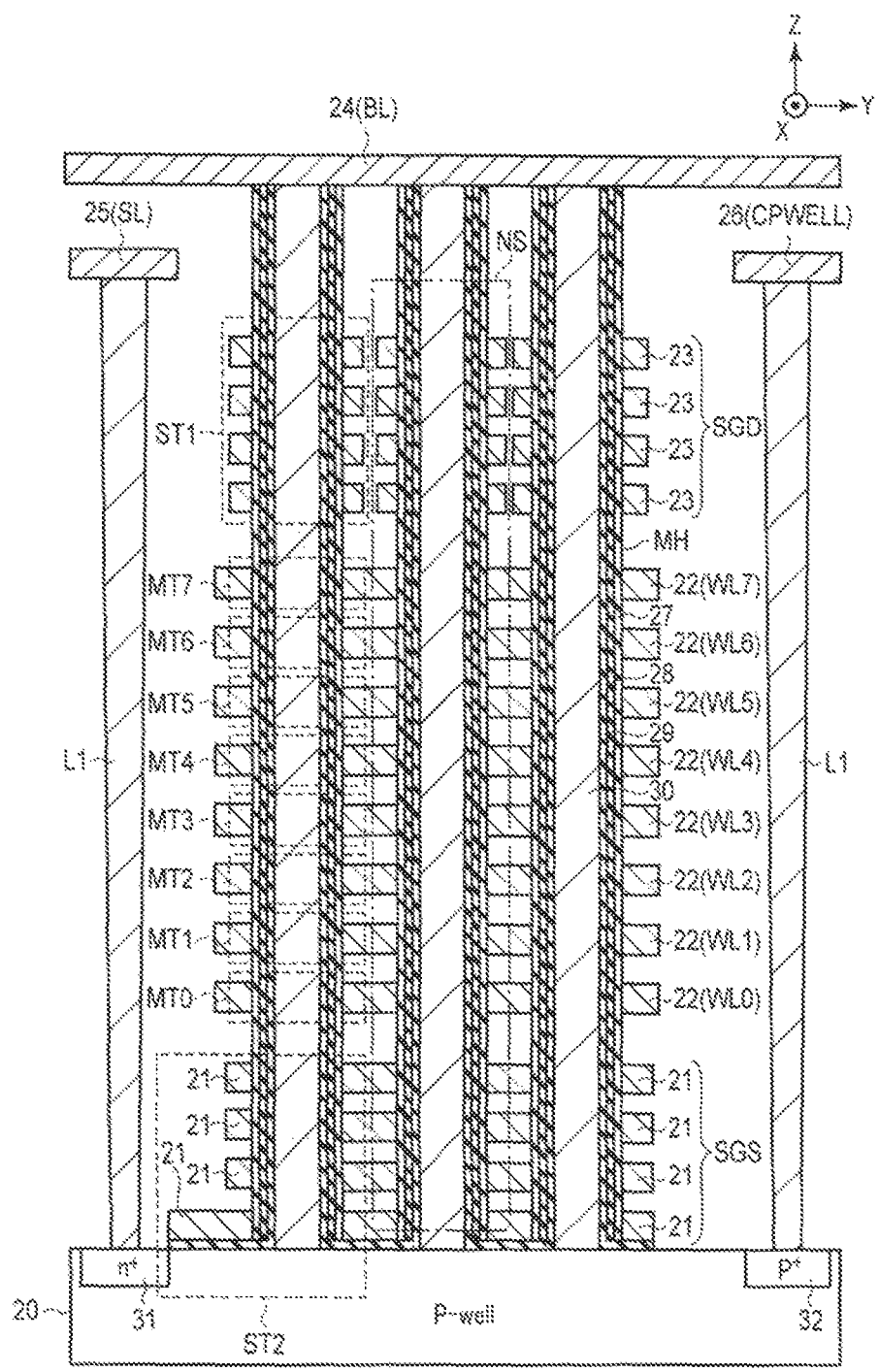
FIG. 4 is a sectional view of the memory cell array of the semiconductor memory device according to the first embodiment.

Next, the sectional structure of the memory cell array 11 will be described by using FIG. 4. FIG. 4 depicts a sectional view of the memory cell array 11 and an X axis, a Y axis, and a Z axis which cross one another. In FIG. 4, an interlayer insulating film is not illustrated for simplification of the explanation. As depicted in FIG. 4, the semiconductor memory device 10 includes a P-type well region 20, wiring layers 21 to 26, a plurality of semiconductor pillars MH, and a plurality of contact plugs LI.

The P-type well region 20 is formed in a front surface of a semiconductor substrate. Above the P-type well region 20, the wiring layers 21 to 23 are stacked in order. The wiring layers 21 to 23 function as the select gate line SGS, the word line WL, and the select gate line SGD, respectively. That is, the numbers of layers of the wiring layer 21, the numbers of layers of the wiring layer 22, and the numbers of layers of the wiring layer 23 correspond to the number of select gate lines SGS, the number of word lines WL, and the number of select gate lines SGD, respectively.

As depicted in FIG. 4, more than one wiring layer 21 corresponding to the select gate line SGS and more than one wiring layer 23 corresponding to the select gate line SGD may be provided. Moreover, the wiring layers 21 to 23 are provided in the shape of a plate spreading in X and Y directions.

The plurality of semiconductor pillars MH are formed so as to reach the upper surface of the P-type well region 20 from the upper surface of the wiring layer 23. That is, the semiconductor pillars MH are provided as to as pass through the wiring layers 21 to 23 in a Z direction. On the side faces of these semiconductor pillars MH, a block insulating film 27, an insulating film functioning as a charge storage layer 28, and a tunnel oxide film 29 are formed in order. Moreover, in each semiconductor pillar MH, inside the tunnel oxide film 29, a semiconductor material 30 containing a conductive material is embedded. It is to be noted that the part of the semiconductor pillar MH inside the tunnel oxide film 29 may include a plurality of materials.

Above the wiring layer 23 and the semiconductor pillars MH, a wiring layer 24 corresponding to the bit line BL is formed. The bit line BL is connected to the corresponding semiconductor pillar MH. It is to be noted that, between the bit line BL and the corresponding semiconductor pillar MH, a contact plug containing a conductive material may be formed.

Between the wiring layers 23 and 24, wiring layers 25 and 26 corresponding to the source line SL and a well line CPWELL, respectively, are formed. The wiring layer 25 is connected, via the contact plug LI, to an $n^+$-type impurity diffusion region 31 formed in the front surface of the well region 20. The wiring layer 26 is connected, via the contact plug LI, a $p^+$-type impurity diffusion region 32 formed in the front surface of the well region 20. It is to be noted that each contact plug LI is provided in the shape of a plate spreading in the X and Z directions.

In the above configuration, one semiconductor pillar MH corresponds to one NAND string NS. Specifically, a point of intersection of the select gate line SGD and the semiconductor pillar MH and a point of intersection of the select gate line SGS and the semiconductor pillar MH correspond to the select transistors ST1 and ST2, respectively. Likewise, a point of intersection of the word line WL and the semiconductor pillar MH corresponds to the memory cell transistor MT.

Moreover, a plurality of above configurations are arranged in the X direction. For example, one string unit SU includes a group of a plurality of NAND strings NS arranged in the X direction. If a plurality of string units SU are provided in the same block BLK, the wiring layer 23 corresponding to the select gate line SGD is separated between the string units SU.

It is to be noted that the lowermost wiring layer 21 and the lowermost tunnel oxide film 29 are provided to an area near the $n^+$-type impurity diffusion region 31. As a result, when the select transistor ST2 enters an ON state, a current path is formed between the NAND string NS and the $n^+$-type impurity diffusion region 31.

Moreover, the memory cell array 11 may have other configurations. The configuration of the memory cell array 11 may have the configurations described in, for example, U.S. patent application Ser. No. 12/407,403 entitled "Three Dimensional Stacked Nonvolatile Semiconductor Memory" filed on Mar. 19, 2009, U.S. patent application Ser. No. 12/406,524 entitled "Three Dimensional Stacked Nonvolatile Semiconductor Memory" filed on Mar. 18, 2009, U.S. patent application Ser. No. 12/679,991 entitled "Nonvolatile Semiconductor Memory Device and Method of Manufacturing the Same" filed on Mar. 25, 2010, and U.S. patent application Ser. No. 12/532,030 entitled "Semiconductor Memory and Method of Manufacturing the Same" filed on Mar. 23, 2009. The entire contents of these patent applications are incorporated herein by reference.

[1-1-3] Configuration of the Sense Amplifier Module 12

Figure 5:
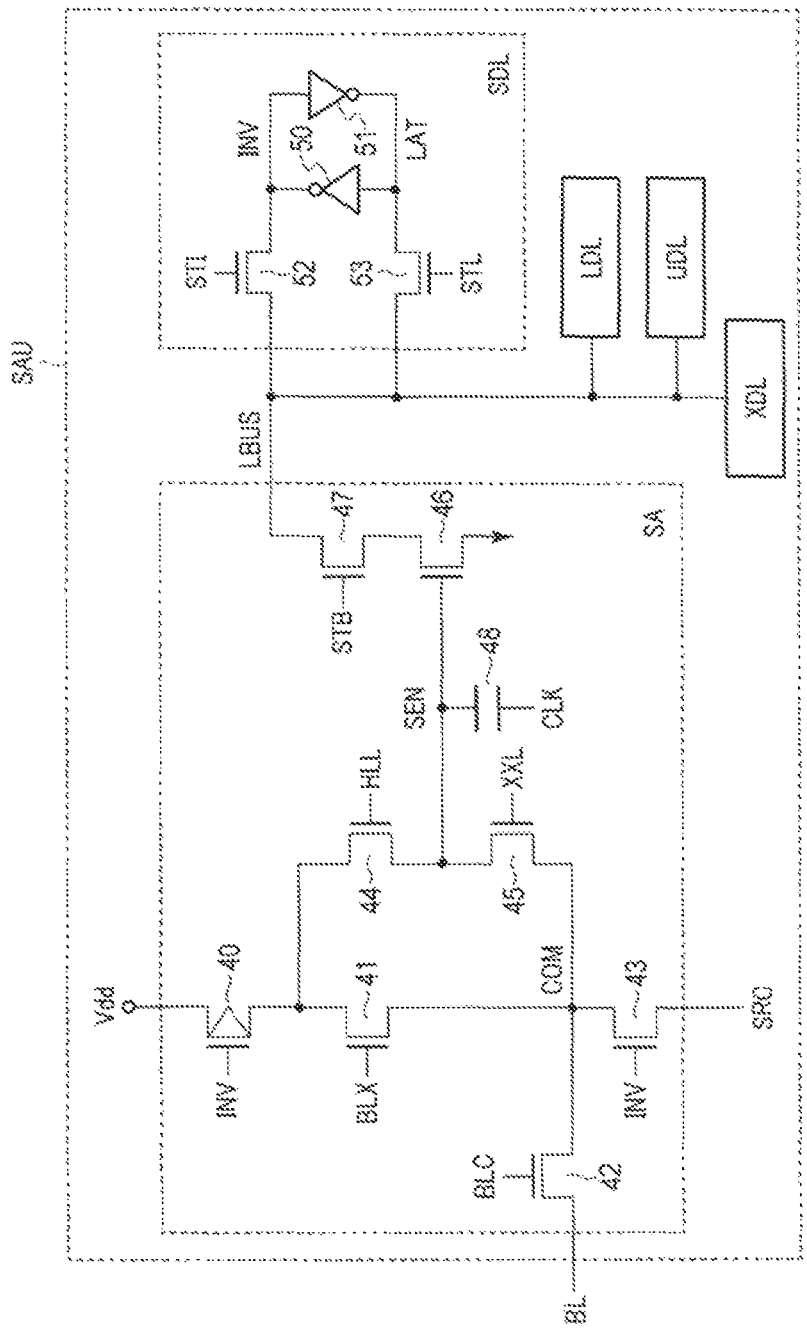
FIG. 5 is a circuit diagram of a sense amplifier module of the semiconductor memory device according to the first embodiment.

Next, the configuration of the sense amplifier module 12 will be described. The sense amplifier module 12 includes a plurality of sense amplifier units SAU which are provided, one for each bit line BL. The circuit configuration of each sense amplifier unit SAU is depicted in FIG. 5. As depicted in FIG. 5, the sense amplifier unit SAU includes a sense amplifier section SA and latch circuits SDL, LDL, UDL, and XDL. The sense amplifier section SA and the latch circuits SDL, LDL, UDL, and XDL are connected to one another by a bus LBUS so that the sense amplifier section SA and the latch circuits SDL, LDL, UDL, and XDL can send and receive data to and from one another.

At the time of a read operation, the sense amplifier section SA senses the data read into the corresponding bit line BL and determines whether the read data is "0" or "1". Moreover, at the time of a write operation, the sense amplifier section SA applies a voltage to the bit line BL based on the write data. As depicted in FIG. 5, the sense amplifier section SA includes a p-channel MOS transistor 40, n-channel MOS transistors 41 to 47, and a capacitor 48.

One end of the transistor 40 is connected to a power-supply terminal, and the gate of the transistor 40 is connected to a node INV. One end of the transistor 41 is connected to the other end of the transistor 40 and the other end of the transistor 41 is connected to a node COM, and a control signal BLX is input to the gate of the transistor 41. One end of the transistor 42 is connected to the node COM and the other end of the transistor 42 is connected to the corresponding bit line BL, and a control signal BLC is input to the gate of the transistor 42. One end of the transistor 43 is connected to the node COM and the other end of the transistor 43 is connected to a node SRC, and the gate of the transistor 43 is connected to the node INV. One end of the transistor 44 is connected to the other end of the transistor 40 and the other end of the transistor 44 is connected to a node SEN, and a control signal HLL is input to the gate of the transistor 44. One end of the transistor 45 is connected to the node SEN and the other end of the transistor 45 is connected to the node COM, and a control signal XXL is input to the gate of the transistor 45. One end of the transistor 46 is connected to a ground terminal, and the gate of the transistor 46 is connected to the node SEN. One end of the transistor 47 is connected to the other end of the transistor 46 and the other end of the transistor 47 is connected to the bus LBUS, and a control signal STB is input to the gate of the transistor 47. One end of the capacitor 48 is connected to the node SEN, and a clock CLK is input to the other end of the capacitor 48. To the power-supply terminal connected to the one end of the transistor 40, for example, a voltage Vdd which is a power-supply voltage of the semiconductor memory device 10 is applied. Moreover, to the node SRC, for example, a voltage Vss which is a ground voltage of the semiconductor memory device 10 is applied.

The latch circuits SDL, LDL, and UDL temporarily hold read data and write data. The read data determined by the sense amplifier section SA at the time of a read operation and the write data transferred to the latch circuit XDL at the time of writing are transferred to one of the latch circuits SDL, LDL, and UDL, for example. As depicted in FIG. 5, the latch circuit SDL includes inverters 50 and 51 and n-channel MOS transistors 52 and 53.

The inverter 50 has an input terminal connected to a node LAT and an output terminal connected to the node INV. The inverter 51 has an input terminal connected to the node INV and an output terminal connected to the node LAT. One end of the transistor 52 is connected to the node INV and the other end of the transistor 52 is connected to the bus LBUS, and a control signal STI is input to the gate of the transistor 52. One end of the transistor 53 is connected to the node LAT and the other end of the transistor 53 is connected to the bus LBUS, and a control signal STL is input to the gate of the transistor 53. Since the circuit configurations of the latch circuits LDL and UDL are similar to the circuit configuration of the latch circuit SDL described above, detailed explanations of the circuit configurations thereof will be omitted.

The latch circuit XDL is used for input and output of data performed between the sense amplifier unit SAU and the input/output circuit 14. That is, the data received from the input/output circuit 14 is transferred to the latch circuit SDL, LDL, or UDL or the sense amplifier section SA via the latch circuit XDL. Moreover, the data of the latch circuit SDL, LDL, or UDL or the sense amplifier section SA is transferred to the input/output circuit 14 via the latch circuit XDL.

In the above-described configuration of the sense amplifier unit SAU, various control signals are generated by the sequencer 17, for example. In a read operation, timing with which the data read by the sense amplifier section SA is determined is based on timing with which the signal STB is asserted. Moreover, in various operations, the transistor 42 clamps the voltage of the bit line BL based on the signal BLC.

It is to be noted that the configuration of the sense amplifier module 12 is not limited to the above configuration and various changes may be made thereto. For example, the number of latch circuits of the sense amplifier unit SAU is not limited to the number of the above example and is designed based on the number of bits of data which is held by one memory cell transistor MT.

[1-2] Write Operation of the Semiconductor Memory Device 10

Next, the outline of a write operation of the semiconductor memory device 10 will be described. In a write operation, the sequencer 17 repeatedly executes a program loop which is a combination of a program operation and a verification operation while incrementing a program voltage Vpgm.

The program operation is an operation that increases the threshold voltage of a memory cell on which writing is to be performed by applying the program voltage Vpgm to a selected word line WL. Moreover, in the program operation, a precharge operation is performed before the application of the program voltage. The precharge operation is an operation that charges a bit line BL corresponding to a write-protect memory cell and thereby increases the channel potential of the corresponding NAND string NS. Fluctuations in the threshold voltage of the write-protect memory cell are prevented by this precharge operation and a self-boost technique at the time of application of the program voltage.

The verification operation is a read operation that determines whether or not the threshold voltage of a memory cell reached a desired threshold voltage. It is to be noted that the sequencer 17 does not perform verification read on the memory cell that passed verification in the subsequent verification operation.

Then, if the program voltage Vpgm exceeds a predetermined reference voltage Vref by the repetition of the program loop in the write operation, the semiconductor memory device 10 according to the present embodiment makes longer the time of the precharge operation in the subsequent program operation.

Figure 6:
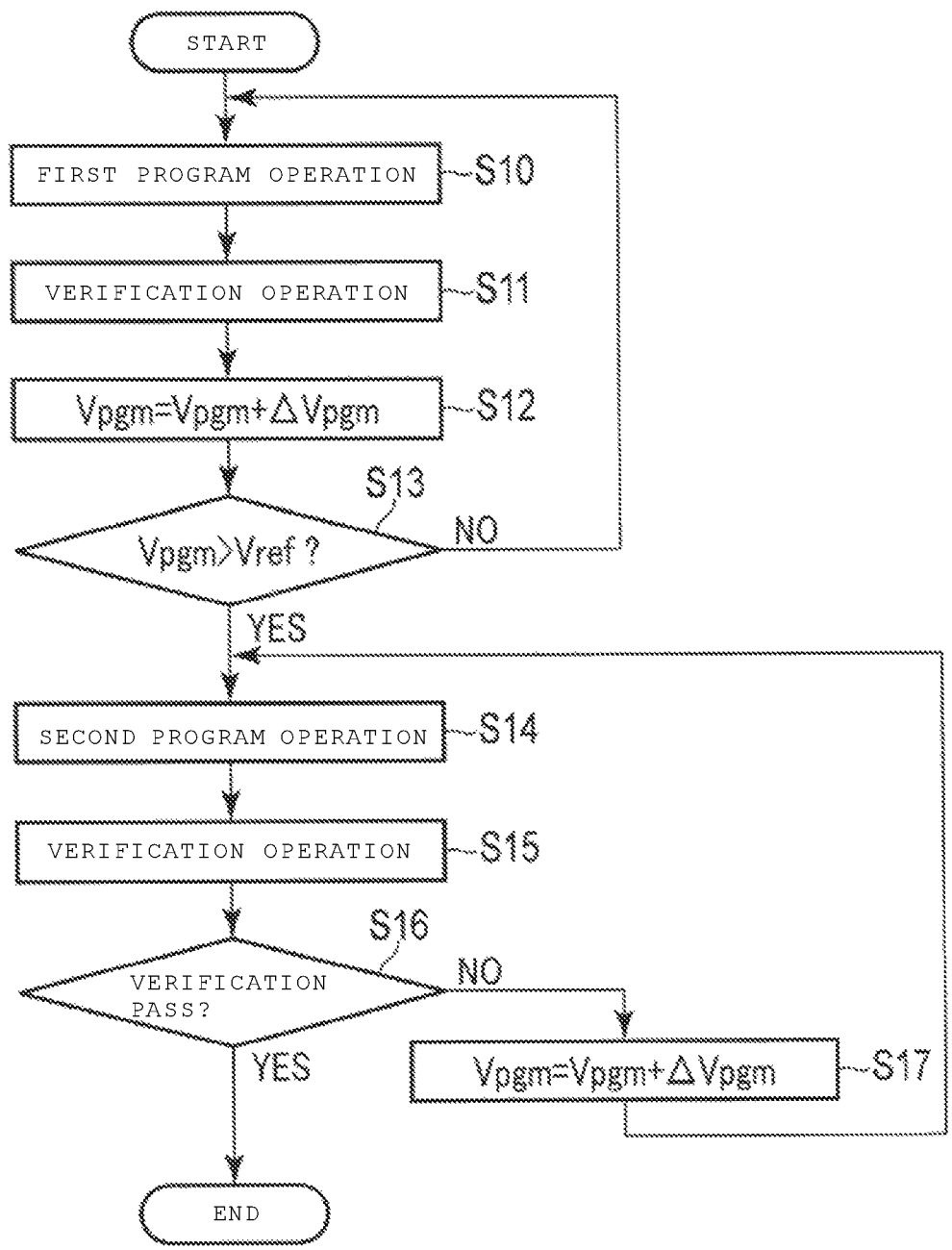
FIG. 6 is a flowchart of a write operation in the semiconductor memory device according to the first embodiment.
Figure 7:
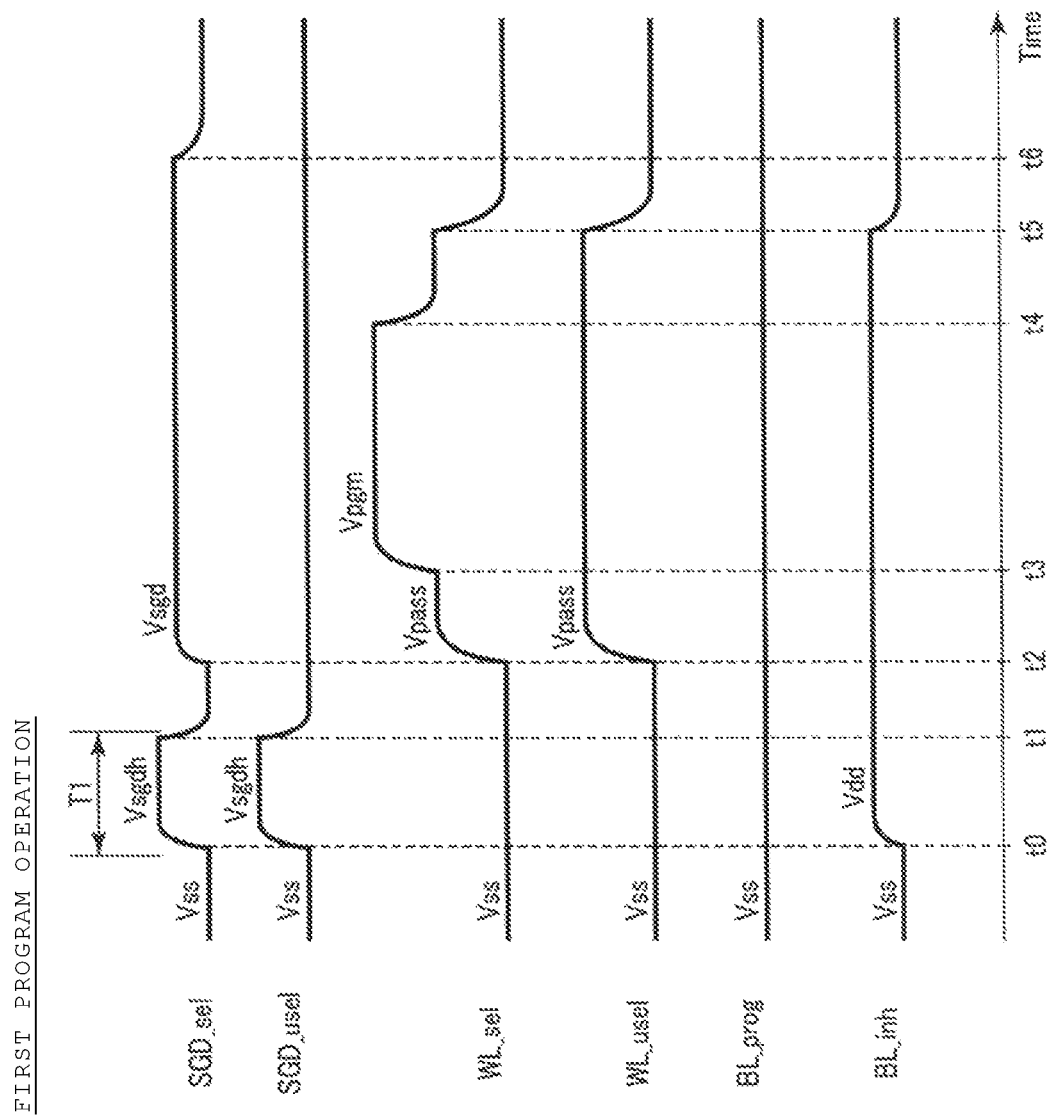
FIG. 7 is a waveform diagram of the write operation in the semiconductor memory device according to the first embodiment.
Figure 8:
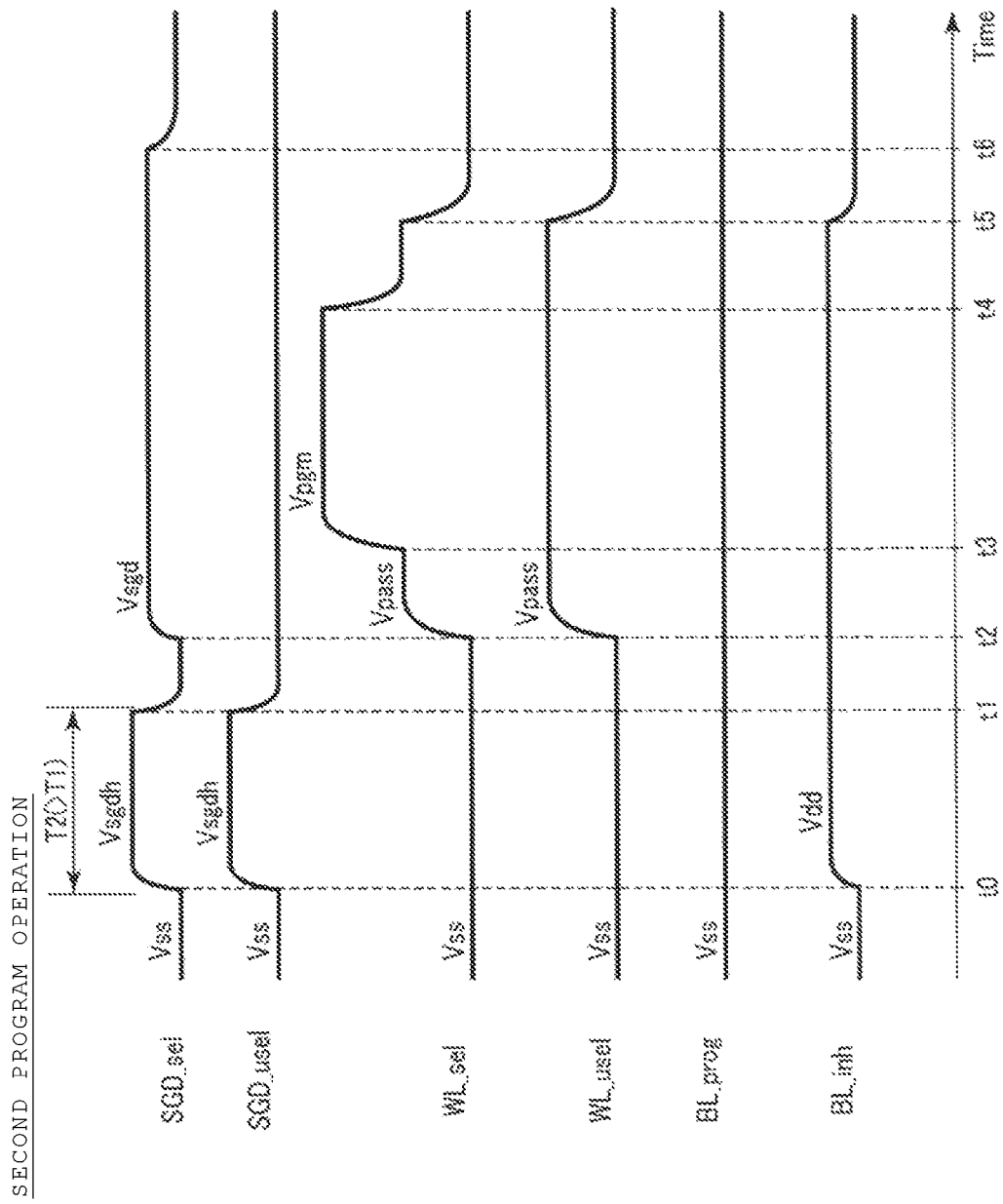
FIG. 8 is a waveform diagram of the write operation in the semiconductor memory device according to the first embodiment.

The details of the write operation described above will be described by using FIGS. 6 to 8. FIG. 6 is a flowchart of the write operation, and FIGS. 7 and 8 depict specific examples of the waveforms of signals in the select gate lines SGD, the word lines WL, and the bit lines BL corresponding to the selected block BLK at the time of the program operation. It is to be noted that, in the following description, selected and non-selected select gate lines SGD will be referred to as select gate lines $SGD_{13}$ sel and SGD_usel, respectively, selected and non-selected word lines WL will be referred to as word lines WL_sel and WL_usel, respectively, and a bit line BL corresponding to a a memory cell on which writing is to be performed and a bit line BL corresponding to a write-protect memory cell will be referred to as bit lines BL_prog and BL_inh, respectively.

As described in FIG. 6, the sequencer 17 first performs a first program operation (Step S10). Specific examples of the waveforms corresponding to the first program operation are depicted in FIG. 7. Here, the details of the first program operation will be described by using FIG. 7.

As depicted in FIG. 7, in an initial state before time t0, the row decoder 13 applies the voltage Vss to the select gate lines SGD and the word lines WL and the sense amplifier module 12 applies the voltage Vss to the bit lines BL.

At time t0, the row decoder 13 applies a voltage Vsgdh to the select gate lines SGD_sel and SGD_usel and the sense amplifier module 12 applies the voltage Vdd to the bit line BL_inh. The voltage Vsgdh is a voltage which is greater than the threshold voltage of the select transistor ST1. When the voltage Vsgdh is applied to the select gate lines SGD_sel and SGD_usel, the corresponding select transistors ST1 enter an ON state and a current path is formed between each bit line BL and the corresponding NAND string NS. In addition, as a result of the application of the voltage Vdd to the bit line BL_inh, the channel potential of the NAND string NS corresponding to the bit line BL_inh increases.

At time t1, the row decoder 13 applies the voltage Vss to the select gate lines SGD_sel and SGD_usel. When the voltage Vss is applied to the select gate lines SGD_sel and SGD_usel, the select transistors ST1 enter an OFF state and the channels of the corresponding NAND strings NS enter a floating state. The channel potential of the NAND string that entered a floating state maintains an increased state by the voltage applied between times t0 and t1. That is, the channel potential of the NAND string NS corresponding to the bit line BL_inh is higher than the channel potential of the NAND string NS corresponding to the bit line BL_prog.

At time t2, the row decoder 13 applies a voltage Vsgd to the select gate line SGD_sel and applies a voltage Vpass to the word lines WL_sel and WL_usel. The voltage Vsgd is a voltage which is greater than the threshold voltage of the select transistor ST1 and lower than the voltage Vsgdh. The voltage Vpass is a voltage at which the memory cell transistor MT whose gate received the voltage Vpass applied thereto is turned on irrespective of the data held thereby. When the voltage Vsgd is applied to the select gate line SGD_sel and the voltage Vdd is applied to the bit line BL_inh, the select transistor ST1 enters an OFF state and the channel of the corresponding NAND string NS enters a floating state. Then, when the voltage Vpass is applied to the word lines WL_sel and WL_usel, the channel potential of the NAND string NS in the floating state increases due to coupling with the word lines WL (a self-boost technique). On the other hand, the channel potential of the NAND string corresponding to the bit line BL_prog maintains the voltage Vss which is being applied by the sense amplifier module 12.

At time t3, the row decoder 13 applies the voltage Vpgm to the word line WL_sel. When the voltage Vpgm is applied to the word line WL_sel, due to a potential difference between the word line WL_sel and the channel of the NAND string NS corresponding to the bit line BL_prog, electrons are injected into the charge storage layer of a memory cell on which writing is to be performed and the threshold voltage of the memory cell increases. On the other hand, since the potential difference between the word line WL_sel and the channel of the NAND string NS corresponding to the bit line BL_inh is reduced by self-boost, fluctuations in the threshold voltage in a write-protect memory cell are prevented.

At time t4, the row decoder 13 decreases the voltage which is being applied to the word line WL_sel to the voltage Vpass.

At time t5, the row decoder 13 decreases the voltage which is being applied to the word lines WL_sel and WL_usel to the voltage Vss, and the sense amplifier module 12 decreases the voltage which is being applied to the bit line BL_inh to the voltage Vss. In response thereto, the channel potential of the NAND string NS in the floating state decreases with a decrease in the voltage of the word lines WL.

At time t6, the row decoder 13 decreases the voltage which is being applied to the select gate line SGD_sel to the voltage Vss. In response thereto, the select transistor ST1 corresponding to the select gate line SGD_sel enters an OFF state and returns to the initial state. Then, the sequencer 17 ends the first program operation and proceeds to the next operation.

The operation performed between time t0 and time t1 described above corresponds to the precharge operation. Here, a period between time t0 and time t1 in which the precharge operation is performed in the first program operation is defined as a period T1. In the following description, the time in which the voltage Vsgdh is applied to the select gate lines SGD_sel and SGD_usel and the voltage Vdd is applied to the bit line BL_inh in the precharge operation will be referred to as a precharge time.

Back in FIG. 6, the sequencer 17 then performs the verification operation (Step S11). Specifically, a verification voltage is applied to the word line WL and a determination is made as to whether or not the threshold voltage of the memory cell exceeds a desired verification voltage. Then, the sequencer 17 increments the program voltage Vpgm by ΔVpgm (Step S12). The sequencer 17 then checks whether or not the program voltage Vpgm exceeds a reference voltage Vref (Step S13). It is to be noted that ΔVpgm and the reference voltage Vref can be set to arbitrary values.

If the program voltage Vpgm is smaller than or equal to the reference voltage Vref (Step S13, NO), the sequencer 17 goes back to Step S10 and repeats the program loop including the first program operation. On the other hand, if the program voltage Vpgm exceeds the reference voltage Vref (Step S13, YES), the sequencer 17 performs a second program operation (Step S14). Specific examples of the waveforms corresponding to the second program operation are depicted in FIG. 8. Here, the details of the second program operation will be described by using FIG. 8.

As depicted in FIG. 8, the second program operation differs from the first program operation described by using FIG. 7 in the length of the precharge operation and the magnitude of the program voltage Vpgm. Specifically, if a period between time t0 and time t1 in which the precharge operation is performed in the second program operation is referred to as a period T2, the period T2 is set so as to be longer than the period T1. That is, the precharge time in the second write operation is longer than the precharge time in the first write operation. Moreover, since the second program operation is included in a program loop which is executed later than a program loop including the first program operation, the program voltage Vpgm in the second program operation is greater than the program voltage Vpgm in the first program operation. Since the other detailed operations of the second program operation are similar to the operations of the first program operation, detailed explanations thereof will be omitted.

Back in FIG. 6, the sequencer 17 then performs the verification operation (Step S15) and subsequently checks whether or not all the memory cells on which writing is to be performed passed verification (Step S16). If there is a memory cell that failed verification (Step S16, NO), the sequencer 17 increments the program voltage Vpgm by ΔVpgm (Step S17), goes back to Step S14, and repeats the program loop including the second program operation. If all the memory cells on which writing is to be performed passed verification (Step S16, YES), the sequencer 17 ends the write operation.

[1-3] Effect of the First Embodiment

The semiconductor memory device 10 according to the present embodiment can improve the reliability of the written data. Hereinafter, the details of this effect will be described.

In the write operation of the semiconductor memory device, before the channel potential of a NAND string corresponding to a write-protect memory cell is increased by self-boost, the precharge operation is sometimes performed. In the precharge operation, by applying a voltage to a write-protect bit line, the sense amplifier module increases the channel potential of a NAND string corresponding to the bit line. As a result, the channel potential which is reachable by self-boost can be increased and an increase in the threshold voltage in the write-protect memory cell can be prevented. The amount of increase in the channel potential of the NAND string by the precharge operation depends on the precharge time, that is, the time in which the sense amplifier module applies the voltage to the write-protect bit line.

Moreover, in the write operation, the program voltage increases by the repetition of the program loop. In the program loop which is executed later, since the program voltage becomes high, the influence of program disturb in the write-protect memory cell grows. Therefore, in order to prevent the influence of program disturb in the write operation, preferably, the later the program loop is executed, the higher the channel potential which is reachable by self-boost is made. That is, an optimum precharge time varies in accordance with the progress of the program loop.

Thus, the semiconductor memory device 10 according to the present embodiment makes the precharge time in the program operation longer in the middle of the write operation. Specifically, the semiconductor memory device 10 makes the precharge time in the program operation in the program loop which is executed later, in which the program voltage Vpgm is high, longer than the precharge time in the program operation in the program loop which is executed earlier, in which the program voltage Vpgm is low.

As a result, the amount of increase in the channel potential in the NAND string NS corresponding to the write-protect memory cell in the program loop which is executed later is larger than the amount of increase in the program loop which is executed earlier. That is, the channel potential which is reachable by self-boost in the program loop which is executed later becomes higher than the channel potential which is reachable by self-boost in the program loop which is executed earlier. Consequently, the program loop which is executed later can improve the effect of preventing an increase in the threshold voltage in the write-protect memory cell by the precharge operation and self-boost.

As described above, the semiconductor memory device 10 according to the present embodiment makes longer the precharge time in the program loop which is executed later, the program loop on which a greater influence of program disturb is exerted. Therefore, the semiconductor memory device 10 according to the present embodiment can prevent the influence of program disturb in the program loop which is executed later and improve the reliability of the written data.

In the above description, timing with which the precharge time is changed is controlled by the sequencer 17. For example, the sequencer 17 changes the precharge time in the program operation if the program voltage Vpgm exceeds the predetermined reference voltage Vref.

Moreover, by changing the length of the precharge time to an appropriate length of time in the middle of the write operation, the semiconductor memory device 10 according to the present embodiment can reduce writing time compared to a case where the same precharge time is applied throughout the write operation. Specifically, by setting a short precharge time in the program operation in the program loop which is executed earlier, in which the effect of preventing program disturb by the precharge operation is small, the semiconductor memory device 10 can reduce the time of the write operation without sacrificing the reliability of the written data.

[2] Second Embodiment

Next, a semiconductor memory device 10 according to a second embodiment will be described. In the write operation, the semiconductor memory device 10 according to the present embodiment omits the precharge operation in the program loop which is executed earlier and inserts the precharge operation in the program loop which is executed later.

[2-1] Write Operation of the Semiconductor Memory Device 10

Figure 9:
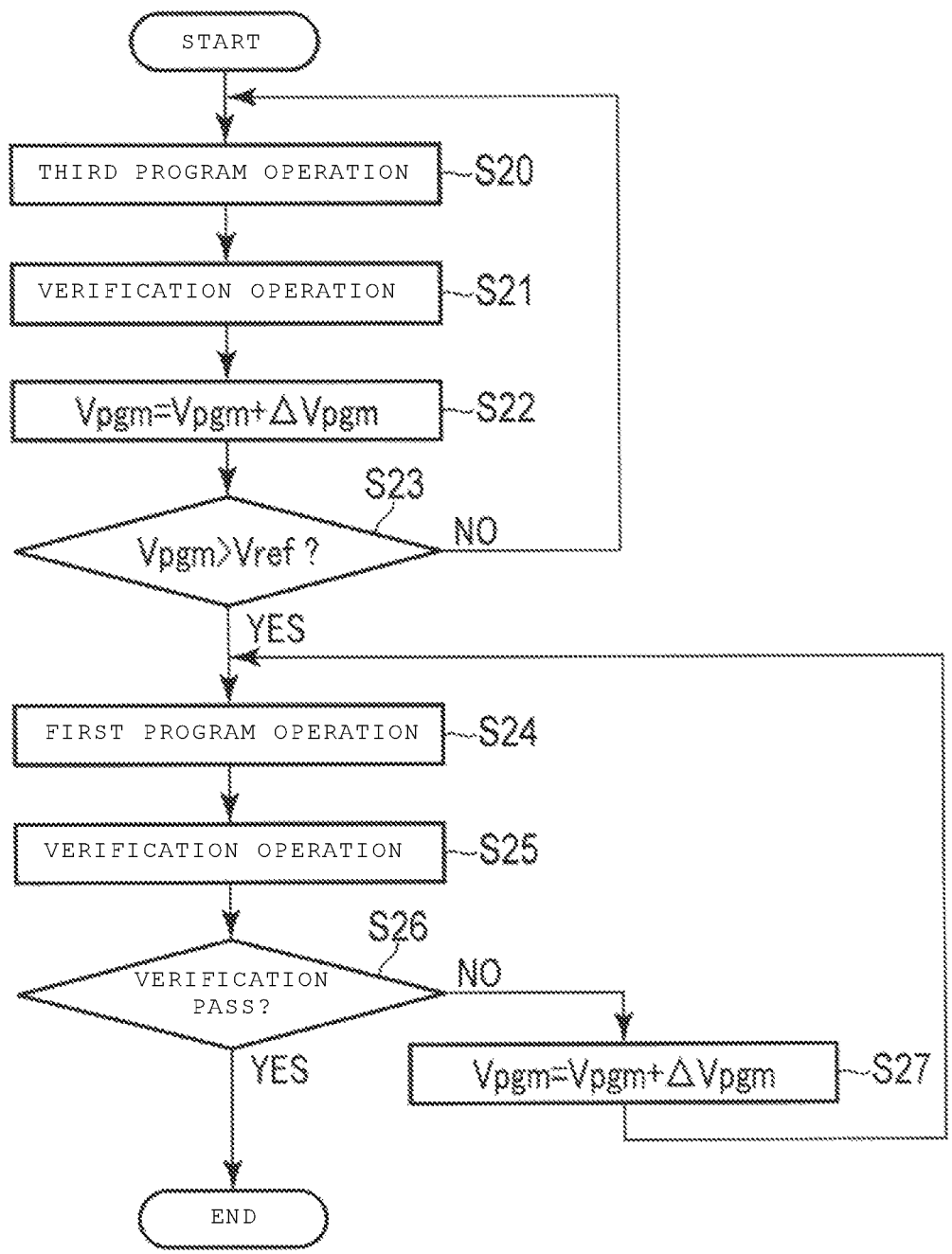
FIG. 9 is a flowchart of a write operation in a semiconductor memory device according to a second embodiment.

Hereinafter, the write operation of the semiconductor memory device 10 will be described by using FIGS. 9 and 10. FIG. 9 is a flowchart of the write operation in the present embodiment, and FIG. 10 depicts specific examples of the waveforms of the select gate lines SGD, the word lines WL, and the bit lines BL corresponding to the selected block BLK at the time of the program operation.

Operations in Steps S20 to S27 described in FIG. 9 correspond to the operations in Steps S10 to S17 described in the first embodiment by using FIG. 6. The operations described in FIG. 9 differ from the operations described in FIG. 6 in the program operation which is performed.

Specifically, the write operation according to the present embodiment is similar to a write operation obtained by replacing the first program operation described in FIG. 6 with a third program operation and replacing the second program operation with the first program operation. Specific examples of the waveforms corresponding to the third program operation are depicted in FIG. 10. Here, the details of the third program operation will be described by using FIG. 10.

Figure 10:
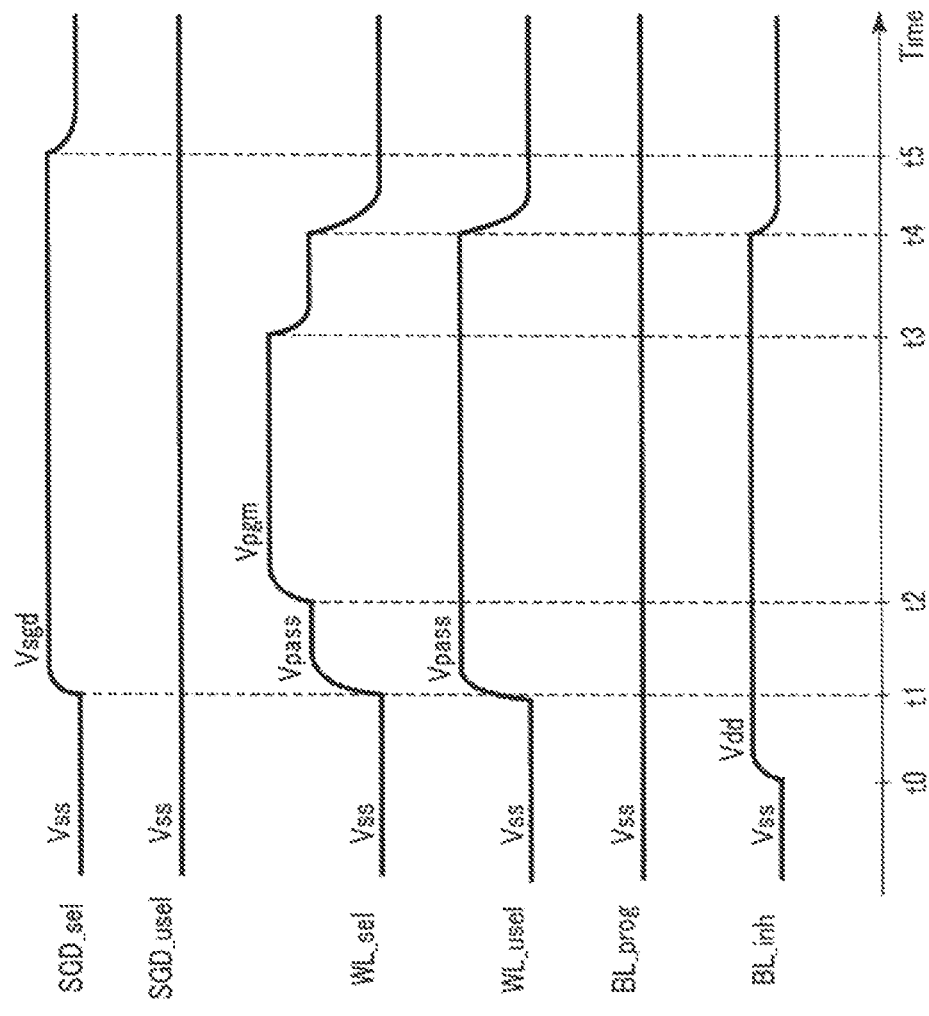
FIG. 10 is a waveform diagram of the write operation in the semiconductor memory device according to the second embodiment.

As depicted in FIG. 10, in an initial state before time t0, the row decoder 13 applies the voltage Vss to the select gate lines SGD and the word lines WL and the sense amplifier module 12 applies the voltage Vss to the bit lines BL. That is, the select transistors ST1 are in an OFF state and the channels of the corresponding NAND strings NS are in a floating state.

At time t0, the sense amplifier module 12 applies the voltage Vdd to the bit line BL_inh. When the voltage of the bit line BL_inh increases to Vdd, the sequencer 17 proceeds to the next operation. Subsequent operations at times t1 to t5 are similar to the operations at times t2 to t6 described in the first embodiment by using FIG. 7. That is, the third program operation corresponds to an operation obtained by omitting the precharge operation from the first program operation described in the first embodiment. Since the other operations are similar to the operations of the write operation described in the first embodiment, detailed explanations thereof will be omitted.

[2-2] Effect of the Second Embodiment

As described above, the semiconductor memory device 10 according to the present embodiment performs the third program operation which does not include the precharge operation in the program loop which is executed earlier in the write operation and, in the program loop which is executed after the program voltage Vpgm exceeds the reference voltage Vref, performs the first program operation including the precharge operation.

That is, the semiconductor memory device 10 according to the present embodiment omits the precharge operation from the program loop which is executed earlier, in which the influence of program disturb is small, and performs the precharge operation in the program loop which is executed later, in which the influence of program disturb grows.

As a result, the semiconductor memory device 10 according to the present embodiment can improve the reliability of the written data as in the case of the first embodiment and increase the write speed as compared to the write operation described in the first embodiment.

[3] Third Embodiment

Next, a semiconductor memory device 10 according to a third embodiment will be described. The semiconductor memory device 10 according to the present embodiment performs a write operation obtained by combining the write operation described in the first embodiment and the write operation described in the second embodiment.

[3-1] Write Operation of the Semiconductor Memory Device 10

Figure 11:
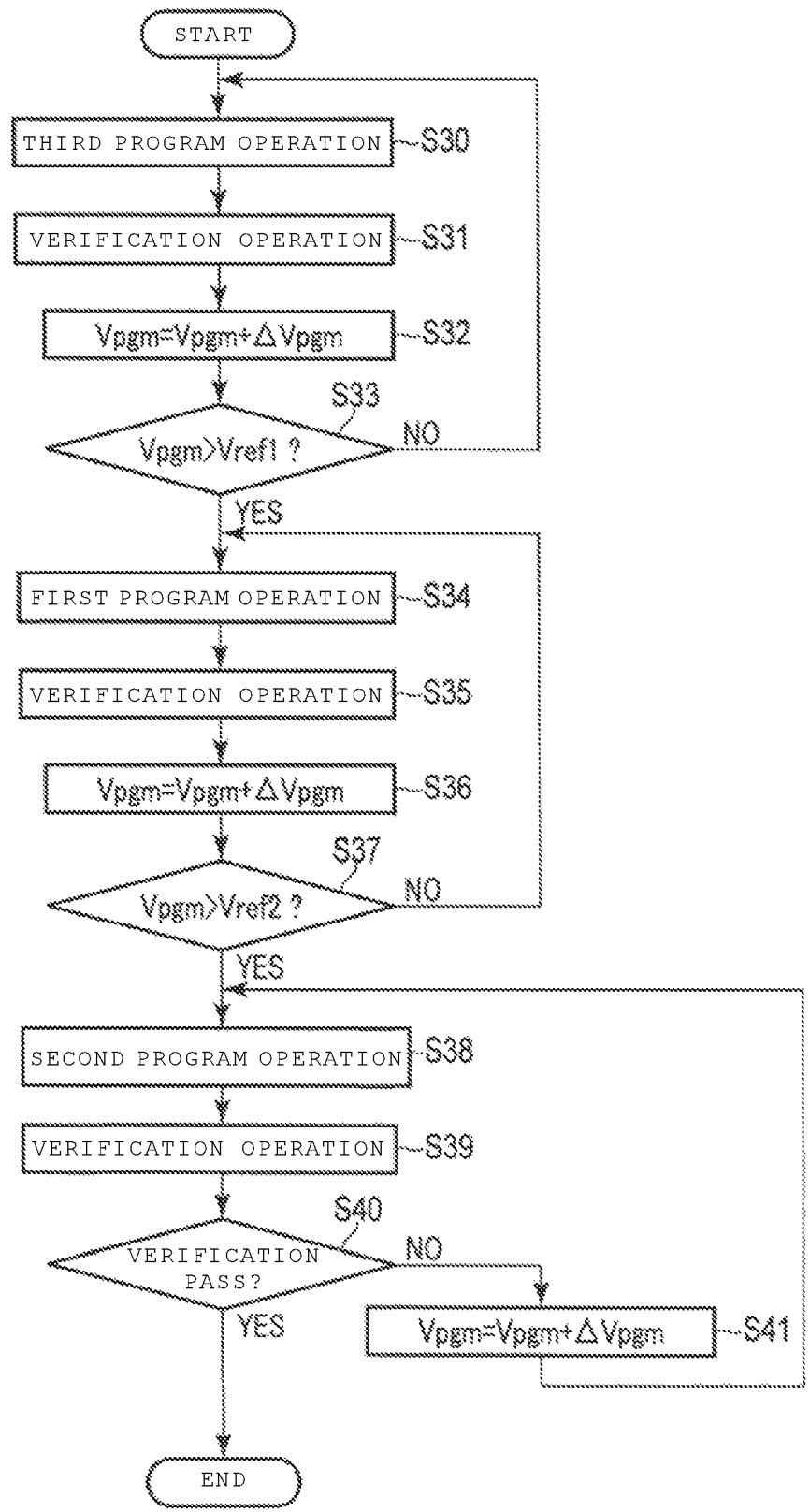
FIG. 11 is a flowchart of a write operation in a semiconductor memory device according to a third embodiment.

Hereinafter, the write operation of the semiconductor memory device 10 will be described by using FIG. 11. FIG. 11 is a flowchart of the write operation in the present embodiment.

Operations in Steps S30 to S33 described in FIG. 11 correspond to the operations in Steps S20 to S23 described in the second embodiment by using FIG. 9, and operations in Steps S34 to S41 correspond to the operations in Steps S10 to S17 described in the first embodiment by using FIG. 6. The operations described in FIG. 11 differ from the operations described in FIGS. 6 and 9 in a condition under which the program operation that is performed in the repeated program loop transitions.

Specifically, in the write operation according to the present embodiment, as a condition under which the third program operation transitions to the first program operation, a determination is made as to whether or not the program voltage Vpgm exceeds a first reference voltage Vref1, and, as a condition under which the first program operation transitions to the second program operation, a determination is made as to whether or not the program voltage Vpgm exceeds a second reference voltage Vref2. The reference voltages Vref1 and Vref2 can be set at arbitrary values, and the second reference voltage Vref2 is set at a value greater than the value of the first reference voltage Vref1. Since the other operations are similar to the operations of the write operations described in the first and second embodiments, detailed explanations thereof will be omitted.

[3-2] Effect of the Third Embodiment

As described above, the semiconductor memory device 10 according to the present embodiment performs the third program operation which does not include the precharge operation in a starting program loop in the write operation, performs the first program operation including the precharge operation in a program loop which is executed after the program voltage Vpgm exceeds the first reference voltage, and performs the second program operation whose precharge operation is set at a longer time in a program loop which is executed after the program voltage Vpgm exceeds the second reference voltage.

That is, the semiconductor memory device 10 according to the present embodiment switches the presence or absence of the precharge operation and the length of the precharge time in the write operation with the progress of the program loop. In other words, the semiconductor memory device 10 can select and perform an optimum program operation in accordance with the degree of influence of program disturb.

As a result, the semiconductor memory device 10 according to the present embodiment can improve the reliability of the written data as in the case of the first and second embodiments and increase the write speed as compared to the write operation described in the first embodiment.

[4] Fourth Embodiment

Next, a semiconductor memory device 10 according to a fourth embodiment will be described. The semiconductor memory device 10 according to the present embodiment makes the precharge time longer based on the number of repetition of execution of program loops in the write operation described in the first embodiment.

[4-1] Write Operation of the Semiconductor Memory Device 10

Figure 12:
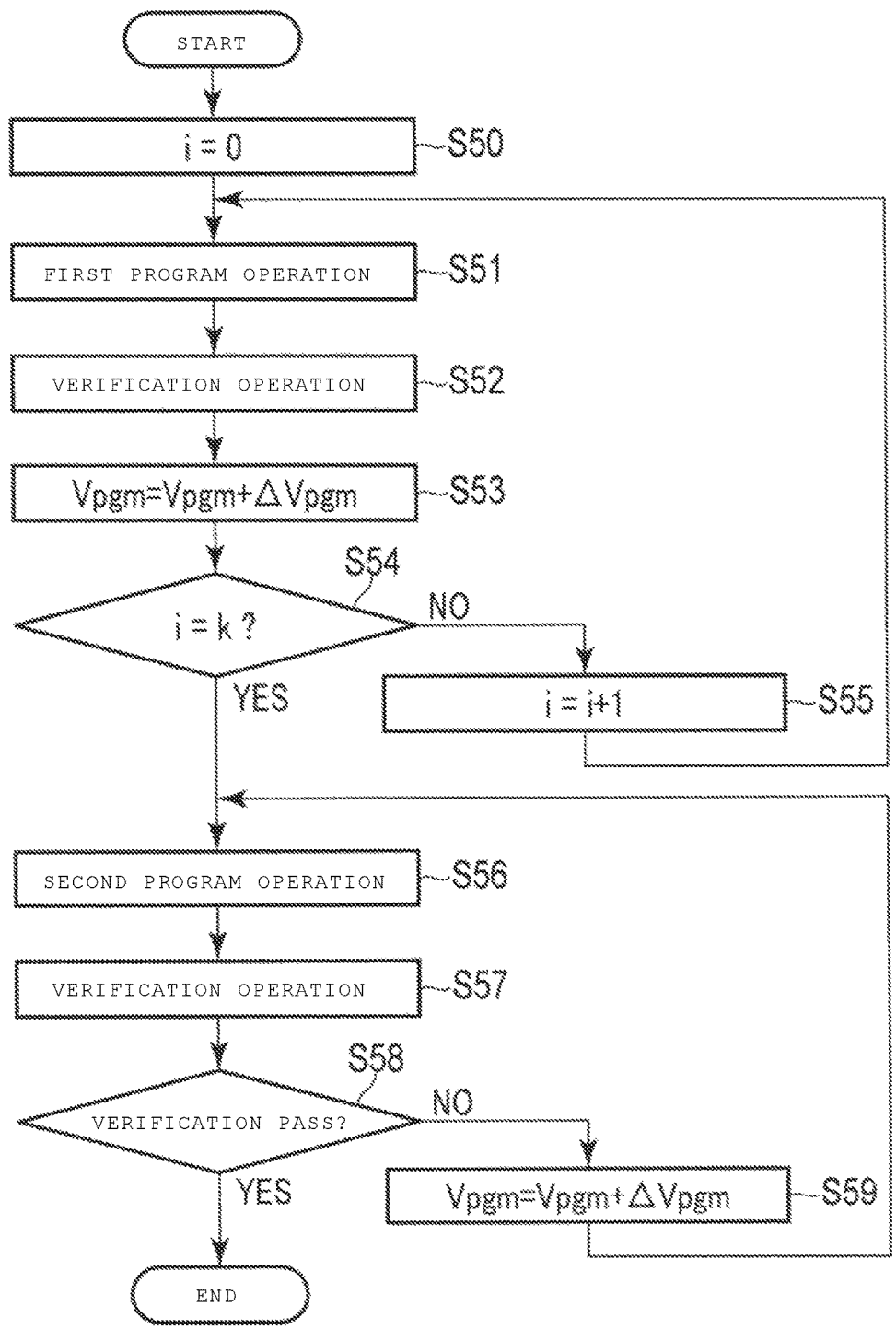
FIG. 12 is a flowchart of a write operation in a semiconductor memory device according to a fourth embodiment.

Hereinafter, the write operation of the semiconductor memory device 10 will be described by using FIG. 12. FIG. 12 is a flowchart of the write operation in the present embodiment.

Operations in Steps S51 to S54 and S56 to S59 described in FIG. 12 correspond to the operations in Steps S10 to S17 described in the first embodiment by using FIG. 6. A step of counting the number of program loops is inserted into the operations described in FIG. 12, and the operations described in FIG. 12 differ from the operations described in FIGS. 6 and 9 in a condition under which the precharge time is changed in each program operation.

Specifically, as depicted in FIG. 12, the sequencer 17 first resets the numerical value of the internal counter (Step S50). Then, the sequencer 17 performs the first program operation (Step S51) and the verification operation (Step S52) and then increments the program voltage Vpgm (Step S53). Here, the sequencer 17 checks whether or not the numerical value of the counter is equal to k (Step S54). The numerical value k can be set at an arbitrary value.

If the numerical value of the counter is not equal to k (Step S54, NO), the sequencer 17 increments the numerical value of the counter. Then, the sequencer 17 goes back to Step S51 and repeats the program loop including the first program operation. On the other hand, if the numerical value of the counter is equal to k (Step S54, YES), the sequencer 17 performs the second program operation (Step S56). Since the subsequent operations are similar to the operations in Step S14 to S17 described in the first embodiment by using FIG. 6, detailed explanations thereof will be omitted.

[4-2] Effect of the Fourth Embodiment

As described above, as in the case of the first embodiment, the semiconductor memory device 10 according to the present embodiment makes the precharge time in the program operation longer in the middle of the write operation. In addition thereto, in the present embodiment, the sequencer 17 changes the precharge time in the program operation if the execution of the program loop is repeated a predetermined number of times.

As a result, as in the case of the first embodiment, the semiconductor memory device 10 according to the present embodiment can improve the reliability of the written data.

[5] Fifth Embodiment

Next, a semiconductor memory device 10 according to a fifth embodiment will be described. The semiconductor memory device 10 according to the present embodiment switches a condition under which the precharge time is changed in the write operation described in the first embodiment if verification of a predetermined level is passed.

[5-1] Write Operation of the Semiconductor Memory Device 10

Figure 13:
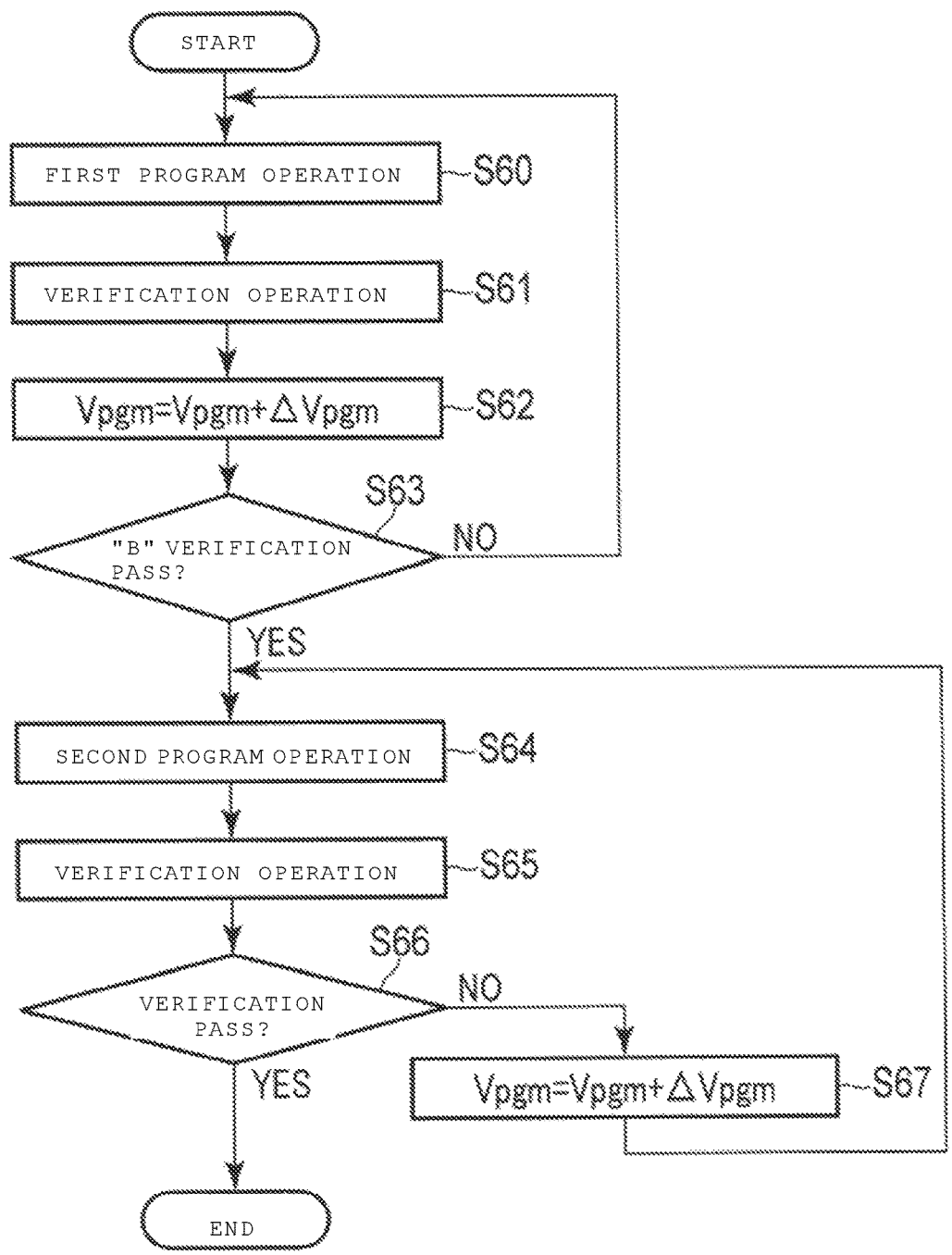
FIG. 13 is a flowchart of a write operation in a semiconductor memory device according to a fifth embodiment.

Hereinafter, the write operation of the semiconductor memory device 10 will be described by using FIG. 13. FIG. 13 is a flowchart of the write operation in the present embodiment.

Operations in Steps S60 to S67 described in FIG. 13 correspond to the operations in Steps S10 to S17 described in the first embodiment by using FIG. 6. The operations described in FIG. 13 differ from the operations described in FIG. 6 in a condition under which the program operation that is performed in the repeated program loop transitions.

Specifically, in the write operation according to the present embodiment, the first program operation transitions to the second program operation if verification of a particular level is passed in a page to be written. Since the other operations are similar to the operations described in the first embodiment by using FIGS. 6 to 8, detailed explanations thereof will be omitted.

[5-2] Effect of the Fifth Embodiment

As described above, as in the case of the first embodiment, the semiconductor memory device 10 according to the present embodiment makes the precharge time in the program operation longer in the middle of the write operation. In addition thereto, in the present embodiment, the sequencer 17 changes the precharge time in the program operation based on timing with which verification is passed.

As a result, as in the case of the first embodiment, the semiconductor memory device 10 according to the present embodiment can improve the reliability of the written data.

[6] Sixth Embodiment

Next, a semiconductor memory device 10 according to a sixth embodiment will be described. The present embodiment is a modified example of the first program operation described in the first embodiment and makes longer the time in which the voltage is applied to the selected bit line BL_prog at the time of the precharge operation.

[6-1] Write Operation of the Semiconductor Memory Device 10

Figure 14:
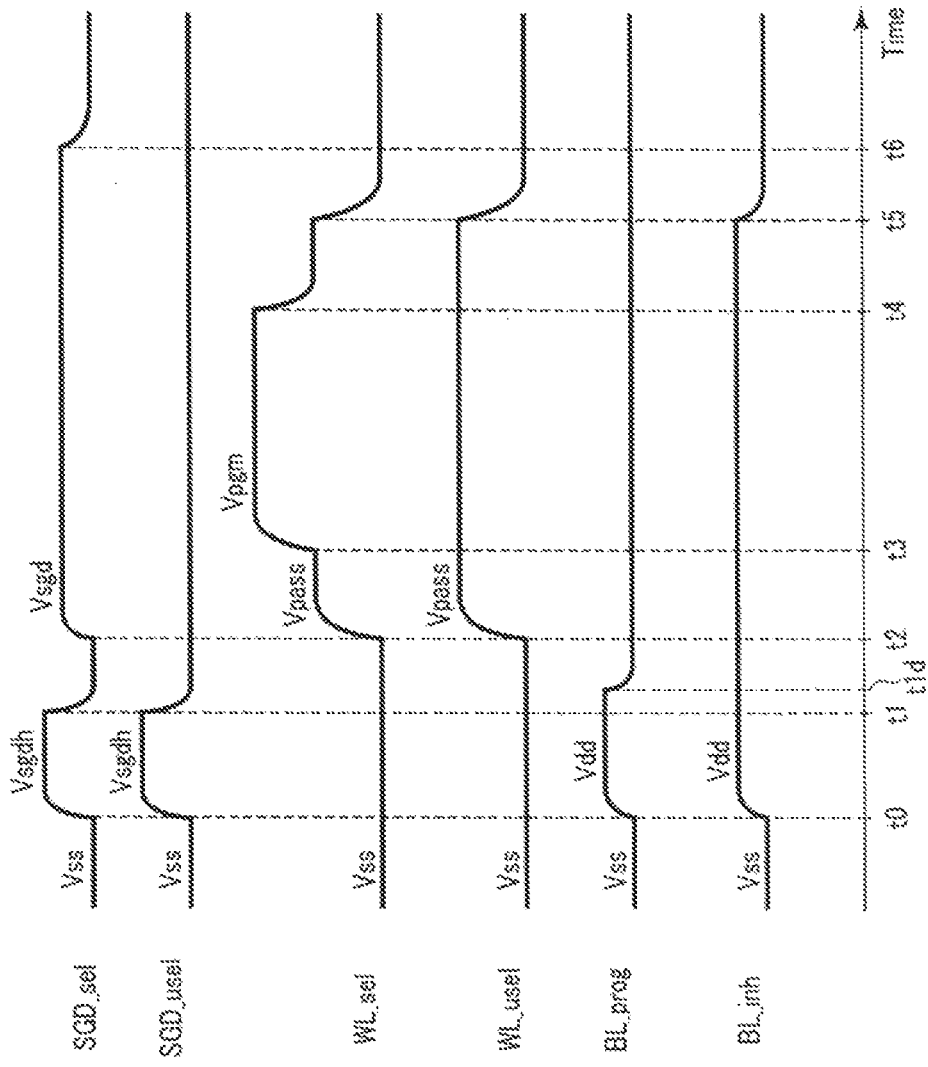
FIG. 14 is a waveform diagram of a write operation in a semiconductor memory device according to a sixth embodiment.

Hereinafter, the modified example of the first program operation will be described by using FIG. 14. FIG. 14 depicts specific examples of the waveforms of the select gate lines SGD, the word lines WL, and the bit lines BL corresponding to the selected block BLK.

As depicted in FIG. 14, the modified example of the first program operation differs from the first program operation described in the first embodiment by using FIG. 7 in the operations at times t0 and t1, and an operation at time t1$d$ between times t1 and t2 is added to the modified example.

Specifically, at time t0, in the first program operation depicted in FIG. 7, the sense amplifier module 12 maintains the voltage of the bit line BL_prog at Vss; in the modified example of the first program operation depicted in FIG. 14, the sense amplifier module 12 applies the voltage Vdd to the bit line BL_prog. As a result, the channel potential of the NAND strings NS corresponding to the bit line BL_prog increases.

At time t1, the row decoder 13 applies the voltage Vss to the select gate lines SGD_sel and SGD_usel. When the voltage Vss is applied to the select gate lines SGD_sel and SGD_usel, the select transistors ST1 enter an OFF state and the channels of the corresponding NAND strings NS enter a floating state. That is, in the present embodiment, the channel potential of the NAND strings NS corresponding to the bit line BL_prog maintains the state in which the channel potential was increased by the voltage applied between time t0 and time t1. Then, at time t1$d$, the sense amplifier module 12 decreases the voltage of the bit line BL_prog to Vss.

At time t2, when the voltage Vsgd is applied to the select gate line SGD_sel, the corresponding select transistor ST1 enters an ON state. At this time, since the voltage of the bit line BL_prog is Vss, the channel potential of the selected NAND string NS in the selected string unit SU decreases, which brings about the same state as the state in the first program operation described in the first embodiment. On the other hand, the NAND strings NS in the non-selected string unit SU maintain the state in which the channel potential was increased by the precharge operation. That is, in the modified example of the first program operation, from the state in which the channel potential of the NAND string which is in the non-selected string unit SU and corresponds to the bit line BL_prog on which writing is to be performed increased, the potential increases due to coupling with the word lines WL. Since the other operations are similar to the operations of the first program operation described in the first embodiment, detailed explanations thereof will be omitted.

[6-2] Effect of the Sixth Embodiment

As described above, from the state in which the channel potential of the NAND string which is in the non-selected string unit SU and corresponds to the bit line BL_prog on which writing is to be performed increased, the channel potential increases due to coupling with the word lines WL. Therefore, the semiconductor memory device 10 according to the present embodiment can make higher the channel potential which is reachable by self-boost. That is, also in the NAND string NS which is in the non-selected string unit SU and corresponds to the bit line BL_prog on which writing is to be performed, the semiconductor memory device 10 can obtain the effect of preventing an increase in the threshold voltage, which is equivalent to the effect obtained in the other NAND strings NS corresponding to the bit line BL_inh on which writing is not to be performed.

As a result, the semiconductor memory device 10 according to the present embodiment can improve the reliability of the written data in the NAND string NS which is in the non-selected string unit SU and corresponds to the bit line BL_prog on which writing is to be performed compared to the first embodiment.

[6] Modified Examples Etc.

The semiconductor memory device 10 according to the above embodiments includes: first and second memory cells <MT, FIG. 2>; first and second select transistors <ST1, FIG. 2> whose one ends are connected to one ends of the first and second memory cells, respectively; first and second bit lines <BL, FIG. 2> connected to the other ends of the first and second select transistors, respectively; a first word line <WL, FIG. 2> connected to the gates of the first and second memory cells; and a first select gate line <SGD, FIG. 2> connected to the gates of the first and second select transistors. A write operation includes a first program loop and a second program loop following the first program loop. The first and second program loops include a program operation that applies a program pulse to the first word line and a verification operation. In the program operation, while the program pulse is being applied to the first word line, a first voltage <Vss, FIG. 7> is applied to the first bit line <BL_prog, FIG. 7>, a second voltage <Vdd, FIG. 7> higher than the first voltage is applied to the second bit line <BL_inh, FIG. 7>, and a third voltage <Vsgd, FIG. 7> higher than the second voltage is applied to the first select gate line <SGD_sel, FIG. 7>, and, before the program pulse is applied to the first word line, the second voltage is applied to the second bit line and a fourth voltage <Vsgdh, FIG. 7> higher than the third voltage is applied to the first select gate line. A period in which the fourth voltage is applied to the first select gate line in the second program loop <T2, FIG. 8> is longer than a period in which the fourth voltage is applied to the first select gate line in the first program loop <T1, FIG. 7>.

As a result, the semiconductor memory device that can improve the reliability of the written data can be provided.

While the above embodiments deal with a case where the same settings are applied to all the word lines WL, an embodiment is not limited thereto. For example, the semiconductor memory device 10 may set a condition under which the precharge time is changed for each word line WL. Specifically, for instance, the reference voltage Vref in Step S13 described in the first embodiment by using FIG. 6 may be set at different values for different word lines WL. For example, the value k in Step S54 described in the fourth embodiment by using FIG. 12 may be set at different values for different word lines WL. For instance, the verification level in Step S63 described in the fifth embodiment by using FIG. 13 may be set at different verification levels for different word lines WL.

The conditions under which the first program operation transitions to the second program operation in the write operations described in the fourth and fifth embodiments may be applied to the write operations described in the second and third embodiments. Moreover, the conditions under which the presence or absence of the precharge operation and the length of the precharge time are changed can be used in combination wherever possible.

It is to be noted that the modified example of the first program operation described in the sixth embodiment can also be applied to the second program operation in a similar manner.

While the description deals with a case where one memory cell is made to store 2-bit data in the write operation described in the above embodiments, an embodiment is not limited thereto. For example, one memory cell may be made to store data of 3 bits or more. Also in such a case, by setting an appropriate condition, the operations described in the above embodiments can be implemented. For instance, if a configuration in which one memory cell is made to store 3-bit data is applied to the fifth embodiment, as a condition under which the presence or absence of the precharge operation and the length of the precharge time are changed, pass of verification of a level subsequent to the "C" level may be set.

It is to be noted that, in the embodiments described above, the memory cell array 11 may not have a configuration in which memory cells are three-dimensionally stacked above a semiconductor substrate. That is, the memory cell array 11 of the semiconductor memory device 10 may have a configuration in which memory cells are two-dimensionally arranged on a semiconductor substrate.

While the description deals with a case where all the memory cells on which writing is to be performed passed verification in Steps S16, S26, S40, S58, and S66, an embodiment is not limited thereto. For example, if a write operation of a page failed a prescribed number of verifications, the sequencer 17 may regard the write operation as a failed write operation. In this case, information to the effect that the write operation of the page failed is sent to the external controller.

It is to be noted that, in the present specification, "connected" means a state in which one thing is electrically connected to the other thing and also includes a state in which, for example, a different element is placed between the one thing and the other thing.

In the above-described embodiments,
(1) in the read operation, a voltage which is applied to a word line selected for the read operation in the "A" level is between 0 and 0.55 V, for example. However, an embodiment is not limited thereto, and the voltage may be any voltage between 0.1 and 0.24 V, between 0.21 and 0.31 V, between 0.31 and 0.4 V, between 0.4 and 0.5 V, or between 0.5 and 0.55 V, for example.

A voltage which is applied to a word line selected for the read operation in the "B" level is between 1.5 and 2.3 V, for example. However, an embodiment is not limited thereto, and the voltage may be any voltage between 1.65 and 1.8 V, between 1.8 and 1.95 V, between 1.95 and 2.1 V, or between 2.1 and 2.3 V, for example.

A voltage which is applied to a word line selected for the read operation in the "C" level is between 3.0 and 4.0V, for example. However, an embodiment is not limited thereto, and the voltage may be any voltage between 3.0 and 3.2 V, between 3.2 and 3.4 V, between 3.4 and 3.5 V, between 3.5 and 3.6 V, or between 3.6 and 4.0 V, for example.

The time of the read operation (tRead) may be between 25 and 38 µs, between 38 and 70 µs, or between 70 and 80 µs, for example. (2) As described earlier, the write operation includes the program operation and the verification operation. In the write operation, a voltage which is first applied to a word line selected at the time of the program operation is between 13.7 and 14.3 V, for example. However, an embodiment is not limited thereto, and the voltage maybe any voltage between 13.7 and 14.0 V or between 14.0 and 14.6 V, for example.

A voltage which is first applied to a word line selected when writing is performed on an odd-numbered word line and a voltage which is first applied to a word line selected when writing is performed on an even-numbered word line may be different from each other.

If incremental step pulse program (ISPP) is used for the program operation, examples of a step-up voltage include about 0.5 V.

A voltage which is applied to a non-selected word line may be between 6.0 and 7.3 V, for example. However, an embodiment is not limited thereto, and the voltage may be any voltage between 7.3 and 8.4 V or may be 6.0 V or lower, for example.

A pass voltage to be applied may be changed depending on whether a non-selected word line is an odd-numbered word line or an even-numbered word line.

The time of the write operation (tProg) may be between 1700 and 1800 µs, between 1800 and 1900 µs, or between 1900 and 2000 µs, for example.

(3) In an erasing operation, a voltage which is first applied to a well which is formed on a semiconductor substrate, the well above which the above-described memory cells are disposed, is between 12.0 and 13.6 V, for example. However, an embodiment is not limited thereto, and the voltage may be any voltage between 13.6 and 14.8 V, between 14.8 and 19.0 V, between 19.0 and 19.8 V, or between 19.8 and 21.0 V, for example.

The time of the erasing operation (tErase) may be between 3000 and 4000 µs, between 4000 and 5000 µs, or between 4000 and 9000 µs, for example.

(4) The structure of the memory cell has a charge storage layer disposed on a semiconductor substrate (a silicon substrate) with a tunnel insulating film having a film thickness of 4 to 10 nm placed therebetween. The charge storage layer can be configured so as to have a stacked structure of an insulating film, such as SiN or SiON, whose film thickness is 2 to 3 nm and polysilicon film having a film thickness of 3 to 8 nm. Moreover, metal such as Ru may be added to polysilicon. On the charge storage layer, an insulating film is provided. This insulating film has, for example, a silicon oxide film having a film thickness of 4 to 10 nm and being sandwiched between a lower High-k film having a film thickness of 3 to 10 nm and an upper High-k film having a film thickness of 3 to 10 nm. Examples of the High-k film include HfO. Moreover, the film thickness of the silicon oxide film can be made greater than the film thickness of the High-k film. On the insulating film, a control electrode having a film thickness of 30 to 70 nm is formed with a material having a film thickness of 3 to 10 nm placed therebetween. Here, the material is a metal oxide film such as TaO or a metal nitride film such as TaN. W or the like can be used as the material of the control electrode.

Moreover, an air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first and second memory cell transistors;
   a first select transistor having a first end connected to one end of the first memory cell transistor;
   a second select transistor having a first end connected to one end of the second memory cell transistor;
   a first bit line connected to a second end of the first select transistor;
   a second bit line connected to a second end of the second select transistor;
   a first word line connected to gates of the first and second memory cell transistors; and
   a first select gate line connected to gates of the first and second select transistors, wherein
   a write operation on the first and second memory cell transistors includes a first program loop and a second program loop following the first program loop, and the first and second program loops each include one or more loops of a program operation during which a program pulse is applied to the first word line and a verification operation following the program operation, and
   the program operation of each loop of the first and second program loops includes a precharge phase and a programing phase following the precharge phase, wherein
   during the programming phase, while the program pulse is being applied to the first word line, a first voltage is applied to the first bit line, a second voltage higher than the first voltage is applied to the second bit line, and a third voltage higher than the second voltage is applied to the first select gate line, and
   during the precharge phase, the second voltage is applied to the second bit line and a fourth voltage higher than the third voltage is applied to the first select gate line, and a period in which the fourth voltage is applied to the first select gate line during the precharge phase within the second program loop is longer than a period in which the fourth voltage is applied to the first select gate line during the precharge phase within the first program loop.

2. The semiconductor memory device according to claim 1, further comprising:
   a controller configured to control the write operation and to cause a transition from the first program loop to the second program loop.

3. The semiconductor memory device according to claim 2, wherein
   the controller causes the transition from the first program loop to the second program loop based on a voltage value of the program pulse.

4. The semiconductor memory device according to claim 2, wherein
   the controller causes the transition from the first program loop to the second program loop based on a number of executed loops within the first program loop.

5. The semiconductor memory device according to claim 2, wherein
   the controller causes the transition from the first program loop to the second program loop based on pass of the verification operation.

6. The semiconductor memory device according to claim 1, further comprising:
a third memory cell transistor;
a third select transistor having a first end connected to one end of the third memory cell transistor and a second end connected to the first bit line; and
a second select gate line connected to a gate of the third select transistor, wherein
during the precharge phase, while the fourth voltage is applied to the first select gate line, the second voltage is applied to the first bit line, and, after a voltage of the first select gate line decreases from the fourth voltage to the first voltage, a voltage of the first bit line is decreased from the second voltage to the first voltage.

7. A semiconductor memory device comprising:
first and second memory cell transistors;
a first select transistor having a first end connected to one end of the first memory cell transistor;
a second select transistor having a second end connected to one end of the second memory cell transistor;
a first bit line connected to a second end of the first select transistor;
a second bit line connected to a second end of the second select transistor;
a first word line connected to gates of the first and second memory cell transistors; and
a first select gate line connected to gates of the first and second select transistors, wherein
a write operation on the first and second memory cell transistors includes a first program loop and a second program loop following the first program loop, and the first and second program loops each include one or more loops of a program operation during which a program pulse is applied to the first word line and a verification operation following the program operation, and
in the program operation of the first and second program loops, while the program pulse is being applied to the first word line, a first voltage is applied to the first bit line, a second voltage higher than the first voltage is applied to the second bit line, and a third voltage higher than the second voltage is applied to the first select gate line,
in the program operation of the second program loop, before the program pulse is applied to the first word line, the second voltage is applied to the second bit line and a fourth voltage higher than the third voltage is applied to the first select gate line, and
in the program operation of the first program loop, before the program pulse is applied to the first word line, the fourth voltage is not applied to the first select gate line.

8. The semiconductor memory device according to claim 7, further comprising:
a controller configured to control the write operation and to cause a transition from the first program loop to the second program loop.

9. The semiconductor memory device according to claim 8, wherein
the controller causes the transition from the first program loop to the second program loop based on a voltage value of the program pulse.

10. The semiconductor memory device according to claim 8, wherein
the controller causes the transition from the first program loop to the second program loop based on a number of executed loops within the first program loop.

11. The semiconductor memory device according to claim 8, wherein
the controller causes the transition from the first program loop to the second program loop based on pass of the verification operation.

12. A method of performing a write operation in a semiconductor memory device that includes first and second memory cell transistors, a first select transistor having a first end connected to one end of the first memory cell transistor, a second select transistor having a first end connected to one end of the second memory cell transistor, a first bit line connected to a second end of the first select transistor, a second bit line connected to a second end of the second select transistor, a first word line connected to gates of the first and second memory cell transistors, and a first select gate line connected to gates of the first and second select transistors, said method comprising:
executing a first program loop of the write operation;
transitioning to a second program loop of the write operation; and
executing the second program loop of the write operation, wherein
the first and second program loops each include one or more loops of a program operation during which a program pulse is applied to the first word line and a verification operation following the program operation, and
the program operation of each loop of the first and second program loops includes a precharge phase and a programing phase following the precharge phase, wherein
during the programming phase, while the program pulse is being applied to the first word line, a first voltage is applied to the first bit line, a second voltage higher than the first voltage is applied to the second bit line, and a third voltage higher than the second voltage is applied to the first select gate line, and
during the precharge phase, the second voltage is applied to the second bit line and a fourth voltage higher than the third voltage is applied to the first select gate line, and a period in which the fourth voltage is applied to the first select gate line during the precharge phase within the second program loop is longer than a period in which the fourth voltage is applied to the first select gate line during the precharge phase within the first program loop.

13. The method according to claim 12, wherein
the controller causes the transition from the first program loop to the second program loop based on a voltage value of the program pulse.

14. The method according to claim 12, wherein
the controller causes the transition from the first program loop to the second program loop based on a number of executed loops within the first program loop.

15. The method according to claim 12, wherein
the controller causes the transition from the first program loop to the second program loop based on pass of the verification operation.

* * * * *